(12) United States Patent
Kato et al.

(10) Patent No.: US 8,882,915 B2
(45) Date of Patent: Nov. 11, 2014

(54) FILM DEPOSITION APPARATUS, FILM DEPOSITION METHOD, AND COMPUTER READABLE STORAGE MEDIUM

(75) Inventors: Hitoshi Kato, Oshu (JP); Manabu Honma, Oshu (JP); Hiroyuki Kikuchi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1029 days.

(21) Appl. No.: 12/753,932

(22) Filed: Apr. 5, 2010

(65) Prior Publication Data

US 2010/0260935 A1    Oct. 14, 2010

(30) Foreign Application Priority Data

Apr. 9, 2009   (JP) .................. 2009-095210

(51) Int. Cl.
| | | |
|---|---|---|
| C23C 16/455 | (2006.01) | |
| C23C 16/458 | (2006.01) | |
| C23C 16/46 | (2006.01) | |
| H01L 21/67 | (2006.01) | |
| C23C 16/48 | (2006.01) | |
| C23C 16/40 | (2006.01) | |
| C23C 16/54 | (2006.01) | |
| H01L 21/687 | (2006.01) | |

(52) U.S. Cl.
CPC .... *H01L 21/67115* (2013.01); *C23C 16/45519* (2013.01); *C23C 16/482* (2013.01); *C23C 16/463* (2013.01); *C23C 16/46* (2013.01); *C23C 16/458* (2013.01); *C23C 16/45578* (2013.01); *C23C 16/402* (2013.01); *C23C 16/45536* (2013.01); *C23C 16/45551* (2013.01); *C23C 16/54* (2013.01); *H01L 21/6719* (2013.01); *H01L 21/67207* (2013.01); *H01L 21/68764* (2013.01); *H01L 21/68771* (2013.01)
USPC ............................ 118/719; 118/715

(58) Field of Classification Search
USPC ........................... 118/715, 719, 718
See application file for complete search history.

(56) References Cited

U.S. PATENT DOCUMENTS

| | | | | |
|---|---|---|---|---|
| 4,920,917 | A  * | 5/1990  | Nakatani et al. | 118/718 |
| 5,314,724 | A    | 5/1994  | Tsukune et al. | |
| 6,634,314 | B2   | 10/2003 | Hwang et al. | |
| 6,821,563 | B2 * | 11/2004 | Yudovsky | 427/248.1 |
| 7,153,542 | B2 * | 12/2006 | Nguyen et al. | 427/248.1 |
| 8,034,723 | B2 * | 10/2011 | Ohizumi et al. | 438/758 |
| 8,334,015 | B2 * | 12/2012 | Chiang et al. | 427/248.1 |
| 8,372,202 | B2 * | 2/2013  | Kato et al. | 118/719 |
| 8,465,591 | B2 * | 6/2013  | Kato et al. | 118/719 |
| 8,465,592 | B2 * | 6/2013  | Kato et al. | 118/719 |

(Continued)

FOREIGN PATENT DOCUMENTS

| | | |
|---|---|---|
| JP | 04-287912 | 10/1992 |
| JP | 3144664   | 3/2001  |

(Continued)

*Primary Examiner* — Jeffrie R Lund
(74) *Attorney, Agent, or Firm* — IPUSA, PLLC

(57) ABSTRACT

A rotation table on which a wafer is placed is rotated around a vertical axis in order to supply to an upper surface of the wafer a first reaction gas for allowing the first reaction gas to be adsorbed on the upper surface, an auxiliary gas that reacts with the first reaction gas to produce an intermediate product having reflowability, and a second reaction gas that is reacted with the intermediate product to produce a reaction product in this order; and the reaction product is heated by a heating lamp in order to densify the reaction product.

6 Claims, 25 Drawing Sheets

(56) References Cited

U.S. PATENT DOCUMENTS

| | | | |
|---|---|---|---|
| 8,518,183 B2* | 8/2013 | Honma | 118/719 |
| 8,673,079 B2* | 3/2014 | Kato et al. | 118/719 |
| 8,808,456 B2* | 8/2014 | Kato et al. | 118/716 |
| 2004/0067641 A1* | 4/2004 | Yudovsky | 438/680 |
| 2007/0215036 A1* | 9/2007 | Park et al. | 117/88 |
| 2007/0218701 A1 | 9/2007 | Shimizu et al. | |
| 2007/0218702 A1 | 9/2007 | Shimizu et al. | |
| 2009/0066033 A1* | 3/2009 | Lusted et al. | 277/411 |
| 2009/0320749 A1* | 12/2009 | Yoon et al. | 118/58 |
| 2009/0324826 A1* | 12/2009 | Kato et al. | 427/255.28 |
| 2009/0324828 A1* | 12/2009 | Kato et al. | 427/255.28 |
| 2010/0050942 A1* | 3/2010 | Kato et al. | 118/730 |
| 2010/0050943 A1* | 3/2010 | Kato et al. | 118/725 |
| 2010/0050944 A1* | 3/2010 | Kato et al. | 118/730 |
| 2010/0055297 A1* | 3/2010 | Kato et al. | 427/8 |
| 2010/0055312 A1* | 3/2010 | Kato et al. | 427/255.26 |
| 2010/0055314 A1* | 3/2010 | Kato et al. | 427/255.28 |
| 2010/0055315 A1* | 3/2010 | Honma | 427/255.28 |
| 2010/0055316 A1* | 3/2010 | Honma | 427/255.28 |
| 2010/0055319 A1* | 3/2010 | Kato et al. | 427/255.28 |
| 2010/0055320 A1* | 3/2010 | Honma | 427/255.28 |
| 2010/0055347 A1* | 3/2010 | Kato et al. | 427/569 |
| 2010/0055351 A1* | 3/2010 | Kato et al. | 427/595 |
| 2010/0116209 A1* | 5/2010 | Kato | 118/730 |
| 2010/0122710 A1* | 5/2010 | Kato et al. | 134/1 |
| 2010/0124610 A1* | 5/2010 | Aikawa et al. | 427/255.28 |
| 2010/0132625 A1* | 6/2010 | Kato et al. | 118/725 |
| 2010/0136795 A1* | 6/2010 | Honma | 438/758 |
| 2010/0151131 A1* | 6/2010 | Obara et al. | 427/255.28 |
| 2010/0227046 A1* | 9/2010 | Kato et al. | 427/10 |
| 2010/0227059 A1* | 9/2010 | Kato et al. | 427/255.28 |
| 2010/0229797 A1* | 9/2010 | Kato et al. | 118/730 |
| 2010/0260935 A1* | 10/2010 | Kato et al. | 427/255.28 |
| 2010/0260936 A1* | 10/2010 | Kato et al. | 427/255.28 |
| 2011/0039026 A1* | 2/2011 | Kato et al. | 427/255.26 |
| 2011/0048326 A1* | 3/2011 | Kato et al. | 118/723 R |
| 2011/0100489 A1* | 5/2011 | Orito et al. | 137/560 |
| 2011/0139074 A1* | 6/2011 | Kato et al. | 118/730 |
| 2011/0151122 A1* | 6/2011 | Kato et al. | 427/255.23 |
| 2011/0155056 A1* | 6/2011 | Kato et al. | 118/719 |
| 2011/0155057 A1* | 6/2011 | Kato et al. | 118/719 |
| 2011/0155062 A1* | 6/2011 | Kato et al. | 118/728 |
| 2011/0159187 A1* | 6/2011 | Kato et al. | 427/255.26 |
| 2011/0159188 A1* | 6/2011 | Kato et al. | 427/255.394 |
| 2011/0214611 A1* | 9/2011 | Kato et al. | 118/719 |
| 2012/0076937 A1* | 3/2012 | Kato et al. | 427/248.1 |
| 2012/0088030 A1* | 4/2012 | Kato et al. | 427/255.5 |
| 2012/0090545 A1* | 4/2012 | Chiang et al. | 118/719 |
| 2012/0094011 A1* | 4/2012 | Hishiya et al. | 427/8 |
| 2012/0222615 A1* | 9/2012 | Kato et al. | 118/719 |
| 2012/0225195 A1* | 9/2012 | Yudovsky | 427/58 |
| 2012/0303313 A1* | 11/2012 | Moroi et al. | 702/134 |
| 2013/0019801 A1* | 1/2013 | Honma | 118/719 |
| 2013/0042813 A1* | 2/2013 | Kato et al. | 118/730 |
| 2013/0047923 A1* | 2/2013 | Kato et al. | 118/723 AN |
| 2013/0047924 A1* | 2/2013 | Enomoto et al. | 118/725 |
| 2013/0059415 A1* | 3/2013 | Kato et al. | 438/106 |
| 2013/0061804 A1* | 3/2013 | Enomoto et al. | 118/719 |
| 2013/0074770 A1* | 3/2013 | Honma | 118/719 |
| 2013/0087097 A1* | 4/2013 | Kato et al. | 118/663 |
| 2013/0130187 A1* | 5/2013 | Moroi et al. | 432/32 |
| 2013/0149467 A1* | 6/2013 | Kato et al. | 427/569 |
| 2013/0180452 A1* | 7/2013 | Kato et al. | 118/719 |
| 2013/0189849 A1* | 7/2013 | Kato et al. | 438/758 |
| 2013/0203268 A1* | 8/2013 | Kato et al. | 438/778 |
| 2013/0206067 A1* | 8/2013 | Kato et al. | 118/719 |
| 2013/0251904 A1* | 9/2013 | Kato et al. | 427/255.7 |

FOREIGN PATENT DOCUMENTS

| | | |
|---|---|---|
| JP | 2001-254181 | 9/2001 |
| JP | 2006-269621 | 10/2006 |
| JP | 2007-247066 | 9/2007 |

* cited by examiner

FILM DEPOSITION APPARATUS, FILM DEPOSITION METHOD, AND COMPUTER READABLE STORAGE MEDIUM

CROSS-REFERENCE TO RELATED APPLICATION

This application claims the benefit of priority of Japanese Patent Application No. 2009-095210, filed on Apr. 9, 2009 with the Japanese Patent Office, the entire content of which is hereby incorporated by reference.

BACKGROUND OF THE INVENTION

1. Field of the Invention

The present invention relates to a film deposition apparatus and a film deposition method for depositing a film on a substrate by carrying out plural cycles of supplying in turn at least two source gases to the substrate in order to form plural layers of a reaction product, and a storage medium storing a computer program for carrying out the film deposition method.

2. Description of the Related Art

Along with further reduction of pattern feature size in semiconductor devices, a better gap-filling capability in a gap-filling process where concave portions such as trenches formed in a semiconductor wafer are filled with the deposited film is being demanded. There has been known a gap-filling process where a thin film is deposited to fill a concave portion and the thin film is annealed in order to cause the thin film to reflow, so that a void formed in the as-deposited thin film in the concave portion is eliminated. However, the wafer needs to be heated for a relatively long time at a relatively high temperature in order to eliminate the void from the thin film that has once been deposited. Such an annealing process may limit production throughput and adversely affect a device structure formed before the annealing in terms of thermal history.

As another film deposition method except for the CVD method, there has been known a so-called Atomic Layer Deposition (ALD) or a Molecular Layer Deposition (MLD) in which at least two reaction gases are supplied to a wafer under vacuum to deposit a film on the wafer. This technique is advantageous in that the film thickness can be controlled at higher accuracy by the number of times of supplying in turn the gases, and in that the deposited film can have excellent uniformity over the wafer. In addition, because a reaction product is repeatedly deposited layer-by-layer in this film deposition method, a high density film can be obtained, and a conformal film that reflects a surface structure of an underlying layer can be obtained.

A film deposition apparatus suitable for carrying out the ALD method has been disclosed in Patent Documents 1 through 8, for example. Such a film deposition apparatus generally includes a vacuum chamber, a susceptor on which plural wafers are placed along a circumferential direction of the susceptor, the susceptor being provided in the vacuum chamber, and plural gas supplying portions that are provided in the vacuum chamber to oppose the susceptor and supply corresponding process gases (reaction gases).

The wafers W placed on the susceptor are heated and the susceptor is rotated in relation to the gas supplying portions. In addition, a first reaction gas and a second reaction gas are supplied to upper surfaces of the wafers from the corresponding gas supplying portions. The vacuum chamber is provided with a partition wall or an inert gas supplying portion for supplying an inert gas serving as a gas curtain in order to separate a process area where the first reaction gas is supplied and another process area where the second reaction gas is supplied.

As stated above, because the process areas are separated in order to impede the plural reaction gases from being intermixed with each other while the reaction gases are simultaneously supplied in a common vacuum chamber, the wafers are alternately exposed to the first reaction gas and the second reaction gas via the gas curtain or the partition wall. Therefore, the reaction gases supplied to the vacuum chamber need not to be switched, thereby carrying out the ALD method at high throughput.

Patent Document 9 describes a technology where water vapor is supplied after a silicon source gas and then an ozone gas is supplied in film deposition of a silicon oxide film by the ALD method.

Patent Document 1: U.S. Pat. No. 6,634,314
Patent Document 2: Japanese Patent Application Laid-Open Publication No. 2001-254181 (FIGS. 1, 2)
Patent Document 3: Japanese Patent Publication No. 3,144, 664 (FIGS. 1, 2, claim 1)
Patent Document 4: Japanese Patent Application Laid-Open Publication No. H4-287912
Patent Document 5: U.S. Pat. No. 7,153,542 (FIGS. 8A, 8B)
Patent Document 6: Japanese Patent Application Laid-Open Publication No. 2007-247066 (paragraphs 0023 through 0025, 0058, FIGS. 12 and 13)
Patent Document 7: United States Patent Publication No. 2007/218701
Patent Document 8: United States Patent Publication No. 2007/218702
Patent Document 9: Japanese Patent Application Laid-Open Publication No. 2006-269621 (paragraph 0018, and FIG. 1)

SUMMARY OF THE INVENTION

Because the ALD (MLD) method can provide a conformal film, this method is advantageous in terms of gap-filling capability, compared with the CVD method that yields a film with an overhang or a "bread loaf" edge in upper edges of a concave portion formed in a wafer. However, a void may be caused in the film that fills the concave portion even by the ALD method, when the concave portion has a fairly large aspect ratio or a reverse-tapered shape. Therefore, an ALD method capable of filling such a concave portion without a void has been desired. In addition, a reduction of impurities such as organic substances in the deposited film is also desired. Patent Documents 1 through 9 do not disclose a technology that can address such problems.

The present invention has been made in view of the above, and provides a film deposition apparatus and a film deposition method for depositing a film on a substrate by carrying out plural cycles of supplying in turn at least two source gases to the substrate in order to form plural layers of a reaction product, which can provide an excellent gap-filling capability and deposit a high purity film, and a storage medium storing a computer program for carrying out the film deposition method.

A first aspect of the present invention provides a film deposition apparatus for depositing a film on a substrate by rotating a table on which the substrate is placed in relation to plural reaction gas supplying portions configured to supply corresponding reaction gases that react with one another, or rotating the plural reaction gas supplying portions in relation to the table in order to supply in turn the reaction gases to the substrate, thereby producing a layer of a reaction product. The film deposition apparatus includes a substrate receiving area provided to place the substrate on an upper surface of the table in the vacuum chamber; a rotational mechanism configured to rotate the plural reaction gas supplying portions and the table in relation to each other so that the substrate is located in turn in plural process areas where the corresponding reaction gases are supplied from the corresponding gas supplying portions; a first reaction gas supplying portion configured to supply a first reaction gas in order to adsorb the first reaction gas on the substrate, wherein the first reaction gas supplying portion opposes the substrate receiving area on the table; an auxiliary gas supplying portion configured to supply to the substrate an auxiliary gas that reacts with the first reaction gas adsorbed on the substrate to produce an intermediate product having reflowability, wherein the auxiliary gas supplying portion is provided away from and downstream relative to the first reaction gas supplying portion along a relative rotation direction of the table in relation to the plural reaction gas supplying portions, and opposes the wafer receiving area on the table; a second reaction gas supplying portion configured to supply to the substrate a second reaction gas that reacts with the intermediate product on the substrate to produce a reaction product, wherein the second reaction gas supplying portion is provided downstream relative to the auxiliary gas supplying portion along the relative rotation direction, and opposes the wafer receiving area on the table; and a heating portion configured to heat the substrate in order to densify the reaction product, wherein the heating portion is provided downstream relative to the second gas supplying portion and upstream relative to the first reaction gas supplying portion along the relative rotation direction, and opposes the wafer receiving area on the table.

A second aspect of the present invention provides a film deposition method for depositing a film on a substrate by relatively rotating a table on which the substrate is placed and plural reaction gas supplying portions configured to supply corresponding reaction gases that react with one another in order to supply in turn the reaction gases to the substrate, thereby producing a layer of a reaction product. The film deposition method includes steps of placing the substrate in a substrate receiving area on the table provided in the vacuum chamber; rotating the plural reaction gas supplying portions and the table in relation to each other; supplying a first reaction gas to an upper surface of the substrate from a first reaction gas supplying portion provided to oppose the substrate receiving area on the table, thereby adsorbing the first reaction gas on the substrate; supplying to the upper surface of the substrate an auxiliary gas that reacts with the first reaction gas from an auxiliary gas supplying portion that is provided away from and downstream relative to the first reaction gas supplying portion along a relative rotation direction of the table in relation to the plural reaction gas supplying portions, and opposes the wafer receiving area on the table, thereby allowing the auxiliary gas to react with the first reaction gas adsorbed on the substrate to produce an intermediate product having reflowability; supplying to the upper surface of the substrate a second reaction gas that reacts with the intermediate product from a second reaction gas supplying portion that is provided downstream relative to the auxiliary gas supplying portion along the relative rotation direction, and opposes the wafer receiving area on the table, thereby allowing the second reaction gas to react with the intermediate product on the substrate to produce a reaction product; heating the substrate by a heating portion that is provided downstream relative to the second gas supplying portion and upstream relative to the first reaction gas supplying portion along the relative rotation direction, and opposes the wafer receiving area on the table, thereby desifying the reaction product.

A third aspect of the present invention provides a computer readable storage medium storing a computer program for use in a film deposition apparatus for depositing a film on a substrate by relatively rotating a table on which the substrate is placed and plural reaction gas supplying portions configured to supply corresponding reaction gases that react with one another in order to supply in turn the reaction gases to the substrate, thereby producing a layer of a reaction product. The computer program includes instruction steps for causing the film deposition apparatus to execute the film deposition method according to the second aspect.

DETAILED DESCRIPTION OF THE PREFERRED EMBODIMENT

Figure 1:
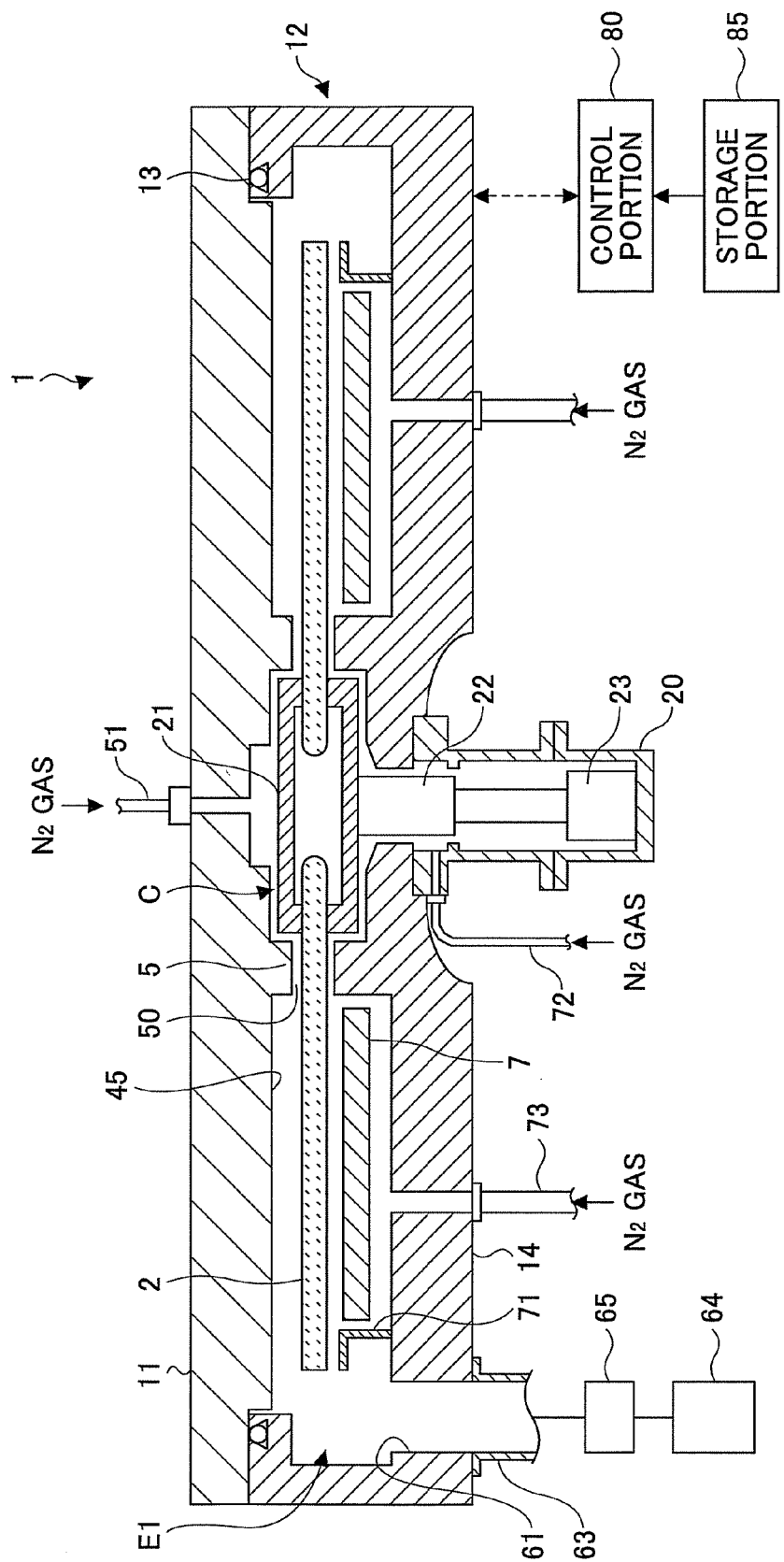
FIG. 1 is a vertical cross-sectional view of a film deposition apparatus according to an embodiment of the present invention.

According to an embodiment of the present invention, a process area where a first reaction gas is adsorbed on a substrate, a process area where an auxiliary gas is supplied to the substrate in order to produce an intermediate product through a chemical reaction between the first gas and the auxiliary gas, a process area where a second reaction gas is supplied to the substrate in order to produce a reaction product through a chemical reaction between the intermediate product and the second reaction gas, and a heating area where the substrate is heated in order to anneal the reaction product for densification are arranged in a vacuum chamber of an ALD method, and a turntable on which the substrate is placed is rotated in order to allow the substrate to pass through those areas. With this, layers of the intermediate product and the reaction product that are gradually formed by allowing the substrate to pass through the areas can reflow every time the substrate passes through the areas, thereby providing an excellent gap-filling capability. In addition, because the layers of the intermediate product and the reaction product can be heated every time the substrate passes through the areas, a film with lower impurity contents can be obtained.

In addition, when the layers of the intermediate product and the reaction product may reflow every time the substrate passes through the areas, only small volumes of the intermediate product and the reaction product actually reflow. Namely, the layers of the intermediate product and the reaction product can certainly reflow even when the substrate stays in an auxiliary area where the auxiliary gas is supplied for only a limited period of time.

Non-limiting, exemplary embodiments of the present invention will now be described with reference to the accompanying drawings. In the drawings, the same or corresponding reference symbols are given to the same or corresponding members or components.

First Embodiment

Figure 2:
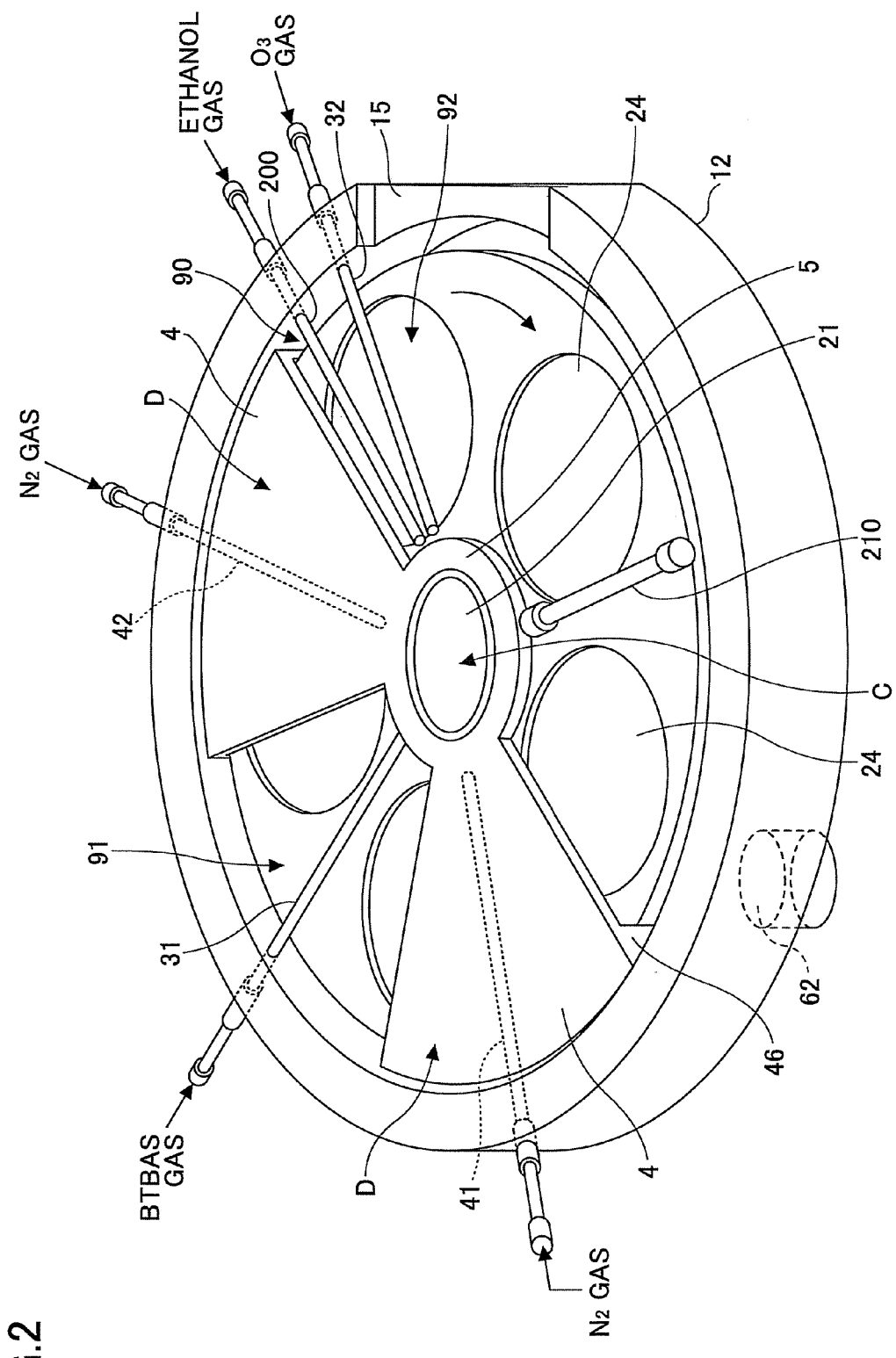
FIG. 2 is a perspective view illustrating an inner configuration of the film deposition apparatus of FIG. 1.
Figure 3:
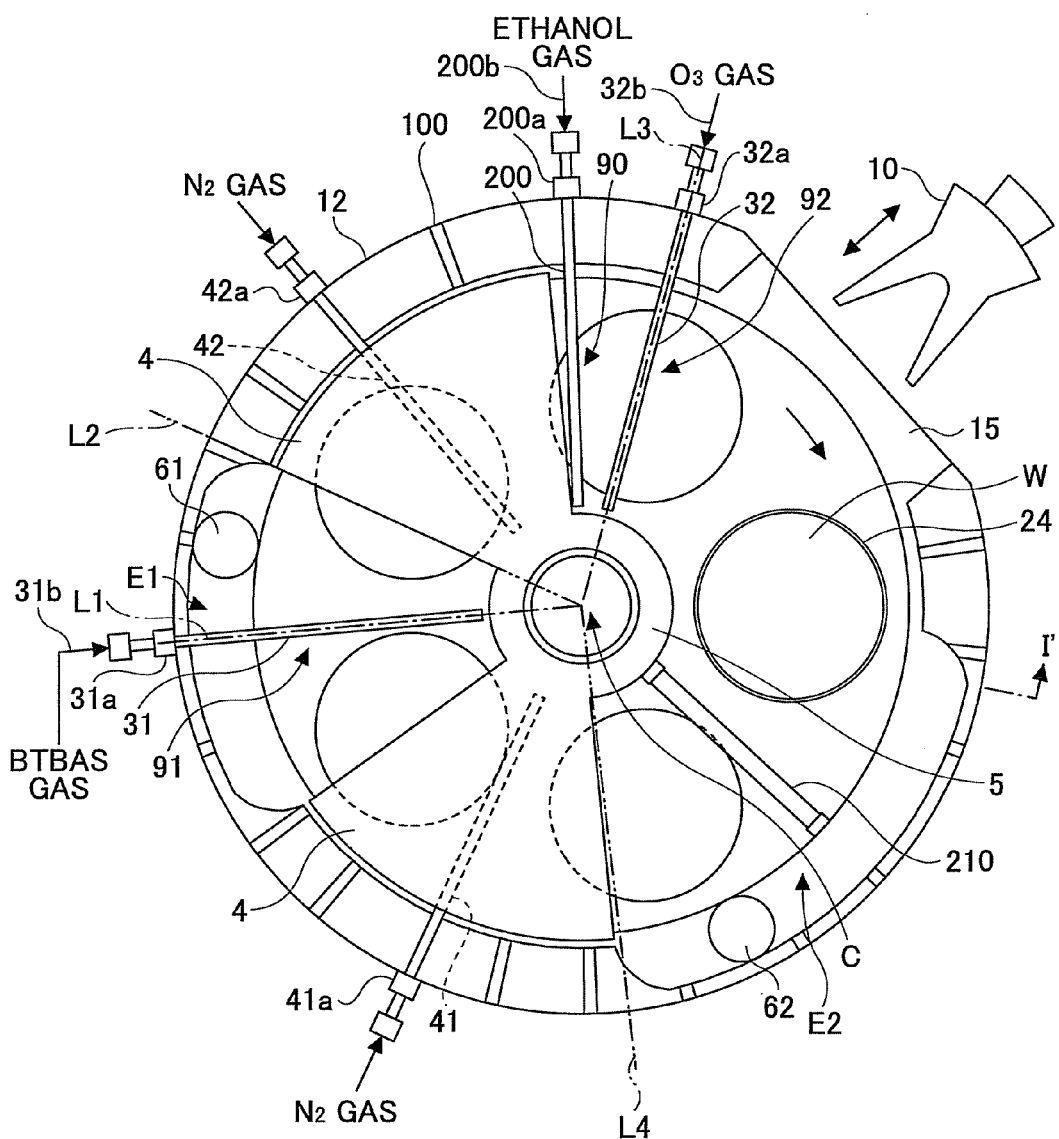
FIG. 3 is a horizontal cross-sectional view of the film deposition apparatus of FIG. 1.

Referring to FIGS. 1 through 3, a film deposition apparatus according to a first embodiment of the present invention has a vacuum chamber 1 having a flattened cylinder top view shape, and a turntable 2 that is located inside the vacuum chamber 1 and has a rotation center in a center of the vacuum chamber 1. The vacuum chamber 1 has a chamber body 12 that has a substantial cup-shape and accommodates the turntable 2, and a ceiling plate 11 that has a circular plate shape and closes an upper opening of the chamber body 12. The ceiling plate 11 is hermetically attached on the chamber body 12 via a sealing member such as an O-ring 13, and can be moved upward/downward to be opened/closed by a driving mechanism (not shown).

The turntable 2 is rotatably attached at its center onto a cylindrically shaped core portion 21. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 clockwise in this embodiment. The rotational shaft 22 and the driving mechanism 23 are housed in a case body 20 having a cylinder with a bottom. The case body 20 is hermetically fixed to a bottom surface of the bottom portion 14 via a flange portion 20a, which isolates an inner environment of the case body 20 from an outer environment.

As shown in FIGS. 2 and 3, plural (e.g., five) circular concave portions 24, each of which receives a semiconductor wafer (referred to as wafer below), are formed in a top surface of the turntable 2 along a rotation direction (circumferential direction). The concave portions 24 are rotated around the vertical center axis of the turntable by rotation of the turntable 2. Incidentally, only one wafer W placed at one of the concave portions is illustrated in FIG. 3, for the sake of convenience.

Figure 4:
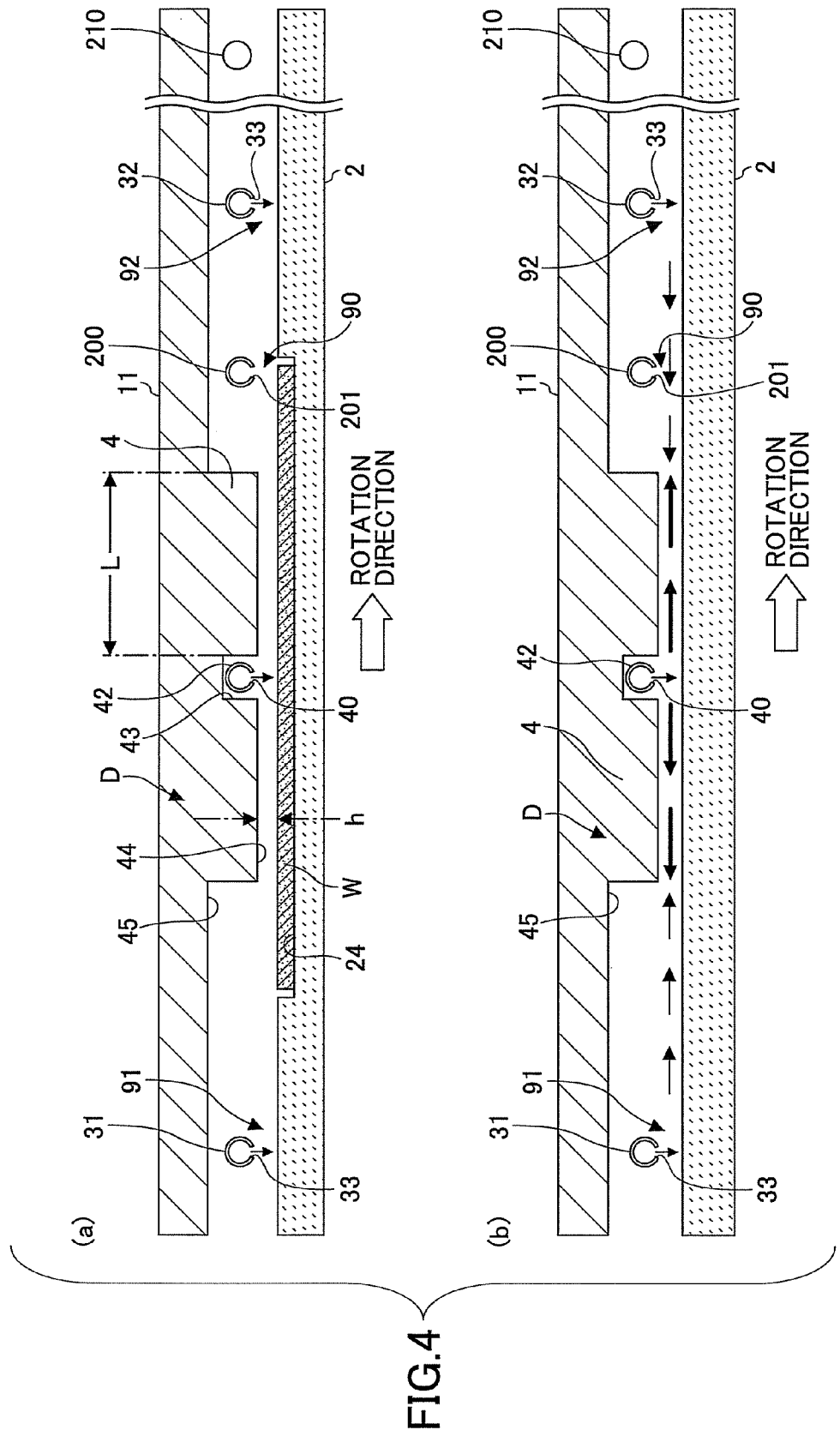
FIG. 4 is a vertical cross-sectional view of a separation area and process areas of the film deposition apparatus of FIG. 1.

FIG. 4 is a projected cross-sectional diagram taken along a circle concentric to the turntable 2. As shown in a subsection (a) of FIG. 4, the concave portion 24 has a diameter slightly larger, for example, by 4 mm than the diameter of the wafer W and a depth equal to a thickness of the wafer W. Therefore, when the wafer W is placed in the concave portion 24, a surface of the wafer W is at the same elevation of a surface of an area of the turntable 2, the area excluding the concave portions 24. If there is a relatively large step between the area of the turntable 2 and the wafer W, gas pressure is varied by the step, which may affect thickness uniformity across the wafer W. This is why the two surfaces are preferably at the same elevation, from a viewpoint of the thickness uniformity across the wafer. While "the same elevation" may mean here that a height difference is less than or equal to about 5 mm, the difference has to be as close to zero as possible to the extent allowed by machining accuracy. In the bottom of the concave portion 24, there are formed three through holes (not shown) through which three corresponding elevation pins 16 (see FIG. 10) are raised/lowered. The elevation pins support a back surface of the wafer W and raise/lower the wafer W.

The concave portions 24 are wafer W receiving areas provided to position the wafers W and prevent the wafers W from being thrown outwardly by centrifugal force caused by rotation of the turntable 2. However, the wafer W receiving areas are not limited to the concave portions 24, but may be realized by guide members that are located at predetermined angular intervals on the turntable 2 to hold the circumference edge of the wafers W. In addition, the wafer W receiving areas may be realized by a chuck mechanism such as an electrostatic chuck. When the chuck mechanism is employed, an area where the wafer W is chucked serves as the wafer receiving area.

Figure 5:
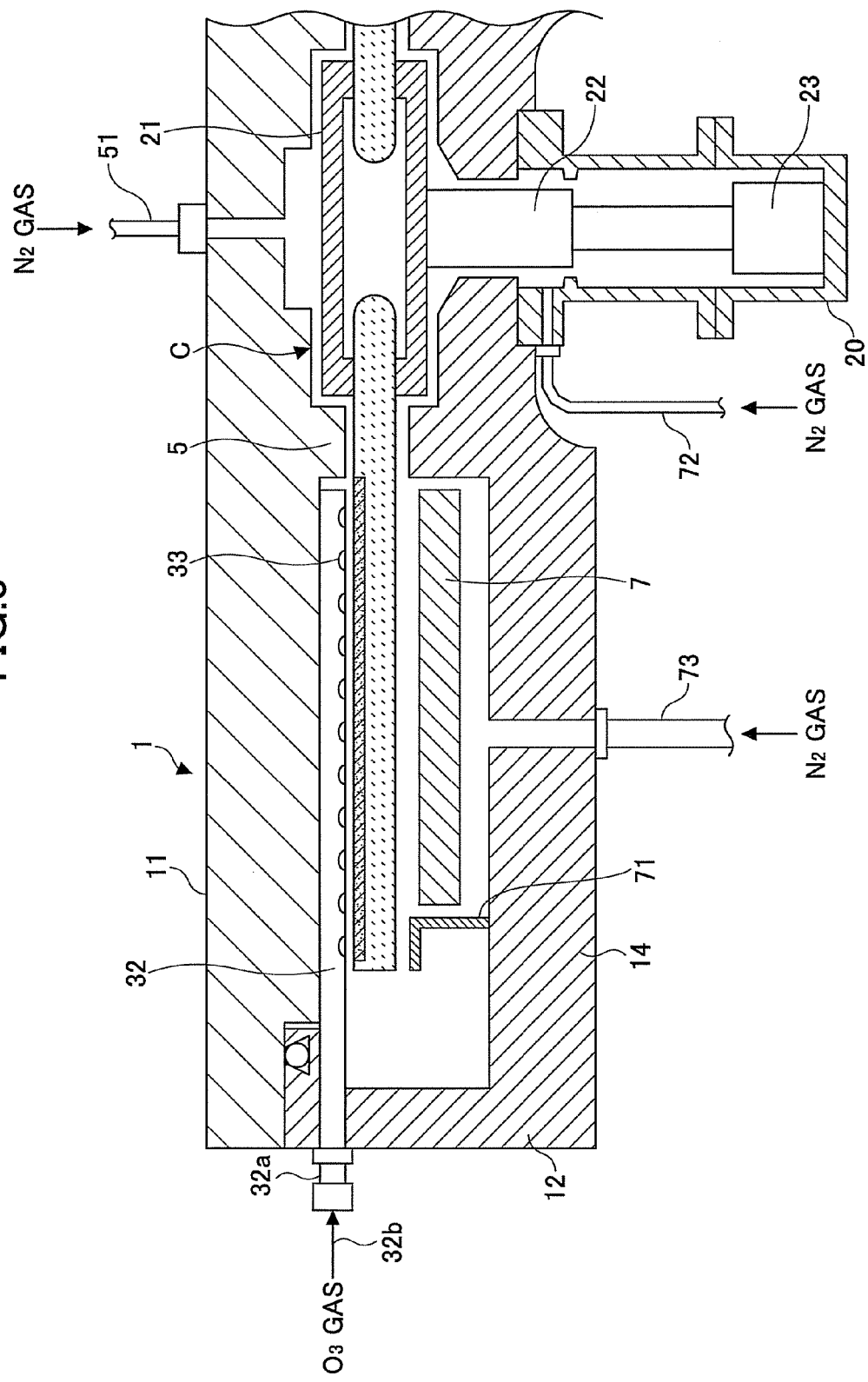
FIG. 5 is an enlarged cross-sectional view of the film deposition apparatus of FIG. 1.

Referring again to FIGS. 2, 3, and 5, a first reaction gas nozzle 31, a second reaction gas nozzle 32, two separation gas nozzles 41, 42, and an auxiliary gas nozzle 200 are provided at angular intervals along the circumferential direction of the vacuum chamber 1 (rotation direction) above the turntable 2. In the illustrated example, the separation gas nozzle 41, the first reaction gas nozzle 31, the separation gas nozzle 42, the auxiliary gas nozzle 200, and the second reaction gas nozzle 32 are arranged in this order along a clockwise direction from a transfer opening 15 (described later). These gas nozzles 41, 31, 42, 200, 32 are attached in the circumferential wall portion of the chamber body 12 in the above order from an area close to one end portion of the transfer opening 15 through an area close to the other end portion of the transfer opening 15. The first reaction gas nozzle 31, 32, the auxiliary gas nozzle 200, and the separation gas nozzles 41, 42 horizontally extend in a direction from the circumferential wall to the center of the vacuum chamber 1, and are supported by attaching their base ends, which are gas inlet ports 31a, 32a, 200a, 41a, 42a, respectively, on the outer circumference of the wall portion so that the inlet ports penetrate the circumferential wall.

The first reaction gas nozzle 31, the second reaction gas nozzle 32, and the auxiliary gas nozzle 200 serve as a first reaction gas supplying portion, a second reaction gas supplying portion, and an auxiliary gas supplying portion. The separation gas nozzles 41, 42 serve as the separation gas supplying portion. These nozzles 31, 32, 200, 41, 42 are attached in the circumferential wall of the vacuum chamber 1 so that their inlet ports go through corresponding through holes 100 formed in the circumferential wall of the vacuum chamber 1. The through holes 100 that are not used are hermetically closed by sealing members (not shown).

Bis (tertiary-butylamino) silane ($SiH_2(NH—C(CH_3)_3)_2$, BTBAS) gas as a first reaction gas is supplied to the first reaction gas nozzle 31 from a gas supplying pipe 31b having a flow rate controller and valves (not shown), and $O_3$ (ozone) gas as a second source gas is supplied to the second reaction gas nozzle 32 from a gas supplying pipe 32b having a flow rate controller and valves (not shown). An auxiliary gas containing hydroxyl (—OH) for silanolization such as alcohol (R—OH, R: alkyl groups), pure water ($H_2O$), hydrogen peroxide ($H_2O_2$), or the like is supplied to the auxiliary gas nozzle 200 from a gas supplying pipe 200b. In this embodiment, ethanol ($C_2H_5OH$) is used as the auxiliary gas. In addition, nitrogen gas ($N_2$) gas as a separation gas is supplied to the separation gas nozzles from a gas supplying pipe (not shown) having a flow rate controller and valves (not shown).

The reaction gas nozzles 31, 32 have plural ejection holes 33 having an inner diameter of, for example, about 0.5 mm to eject the corresponding source gases downward. The plural ejection holes 33 are arranged in longitudinal directions of the reaction gas nozzles 31, 32 (a radius direction of the turntable 2) at intervals of, for example, about 10 mm in this embodiment. The auxiliary gas nozzle 200 has plural ejection holes 201 having an inner diameter of, for example, about 0.5 mm to eject the auxiliary gas downward. The plural ejection holes 201 are arranged in longitudinal directions of the auxiliary gas nozzle 201 (a radius direction of the turntable 2) at intervals of, for example, about 10 mm in this embodiment. The separation gas nozzles 41, 42 have plural ejection holes 40 having an inner diameter of, for example, about 0.5 mm to eject the separation gases downward. The plural ejection holes 40 are arranged in longitudinal directions of the separation gas nozzles 41, 42 (a radius direction of the turntable 2) at intervals of, for example, about 10 mm in this embodiment.

A distance between the gas ejection holes 33 of the reaction gas nozzles 31, 32 and the wafer W is, for example, from about 1 through 4 mm, preferably about 2 mm; a distance between the gas ejection holes 201 of the auxiliary gas nozzle 200 is, for example, about 1 through 4 mm, preferably about 2 mm; and a distance between the gas ejection holes 40 of the separation gas nozzles 41, 42 is, for example, about 1 through 4 mm, preferably about 3 mm. An area below the first reaction gas nozzle 31 may be referred to as a first process area 91 in which the BTBAS gas is adsorbed on the wafer W, and an area below the second reaction gas nozzle 32 may be referred to as a second process area 92 in which the $O_3$ gas is adsorbed on the wafer W. In addition, an area below the auxiliary gas nozzle 200 may be referred to as an auxiliary (process) area 90 in which the ethanol gas is reacted with the BTBAS gas adsorbed on the wafer W, thereby producing an intermediate product.

The separation gas nozzles 41, 42 are provided in order to provide separation areas D for separating the first process area 91, the second process area 92, and the auxiliary area 90. In each of the separation areas D, there is provided a convex portion 4 on the ceiling plate 11, as shown in FIGS. 2 through 4. The convex portion 4 has a top view shape of a sector whose apex lies at the center of the vacuum chamber 1 and whose arced periphery lies near and along the inner circumferential wall of the chamber body 12. The convex portion 4 has a groove portion 43 that extends in the radial direction so that the groove portion 43 substantially bisects the convex portion 4. The separation gas nozzles 41, 42 are located in the corresponding groove portions 43. A circumferential distance between the center axis of the separation gas nozzle 41 (42) and one side of the sector-shaped convex portion 4 is substantially equal to the other circumferential distance between the center axis of the separation gas nozzle 41 (42) and the other side of the sector-shaped convex portion 4.

Incidentally, while the groove portion 43 is formed in order to bisect the convex portion 4 in this embodiment, the groove portion 42 is formed so that an upstream side of the convex portion 4 relative to the rotation direction of the turntable 2 is wider, in other embodiments.

With the above configuration, there are flat low ceiling surfaces 44 (first ceiling surfaces) on both sides of the separation gas nozzle 41 (42), and high ceiling surfaces 45 (second ceiling surfaces) outside of the corresponding low ceiling surfaces 44, as shown in FIG. 4A. The convex portion 4 (first ceiling surface 44) provides a separation space, which is a thin space H, between the convex portion 4 and the turn table 2 in order to impede the first and the second gases from entering the thin space and from being mixed.

Namely, taking an example of the separation area D including the separation gas nozzle 41, the separation gas nozzle 41 may impede the ethanol gas and the $O_3$ gas from entering the thin space between the convex portion 4 and the turntable 2 from the upstream side and the BTBAS gas from entering the thin space from the downstream side of the rotation direction. "The gases being impeded from entering" means that the $N_2$ gas serving as the separation gas ejected from the separation gas nozzle 41 spreads between the first ceiling surfaces 44 and the upper surface of the turntable 2 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" means not only that the gases are completely prevented from entering the space below the convex portion 4 from the adjacent spaces, but also that the gases cannot proceed farther toward the separation gas nozzle 41 and thus the ethanol gas and the $O_3$ gas cannot be intermixed with the BTBAS gas even when a fraction of these gases enter the thin space. Namely, as long as such effect is demonstrated, the separation area D is to separate the first process area 91 and the auxiliary space 90 from the second process area 92. A degree of "thin" of the thin space may be determined so that the effect of "the gases cannot enter the separation space" is demonstrated by a pressure difference caused between the thin space (a space below the convex portion 4) and the adjacent areas (areas below the second ceiling surfaces 45), and the specific height of the thin space may be different depending on the area of the convex portion 4 (the lower ceiling surfaces 44). The BTBAS gas or the $O_3$ gas adsorbed on the wafer W can pass through below the convex portion 5. Therefore, the gases in "the gases being impeded from entering" mean the gases in a gaseous phase. Incidentally, although the ethanol gas and the $O_3$ gas can be intermixed because no separation area D is provided between the auxiliary area 90 and the second process area 92, no adverse effects are caused on film deposition by such mixture.

Figure 6:
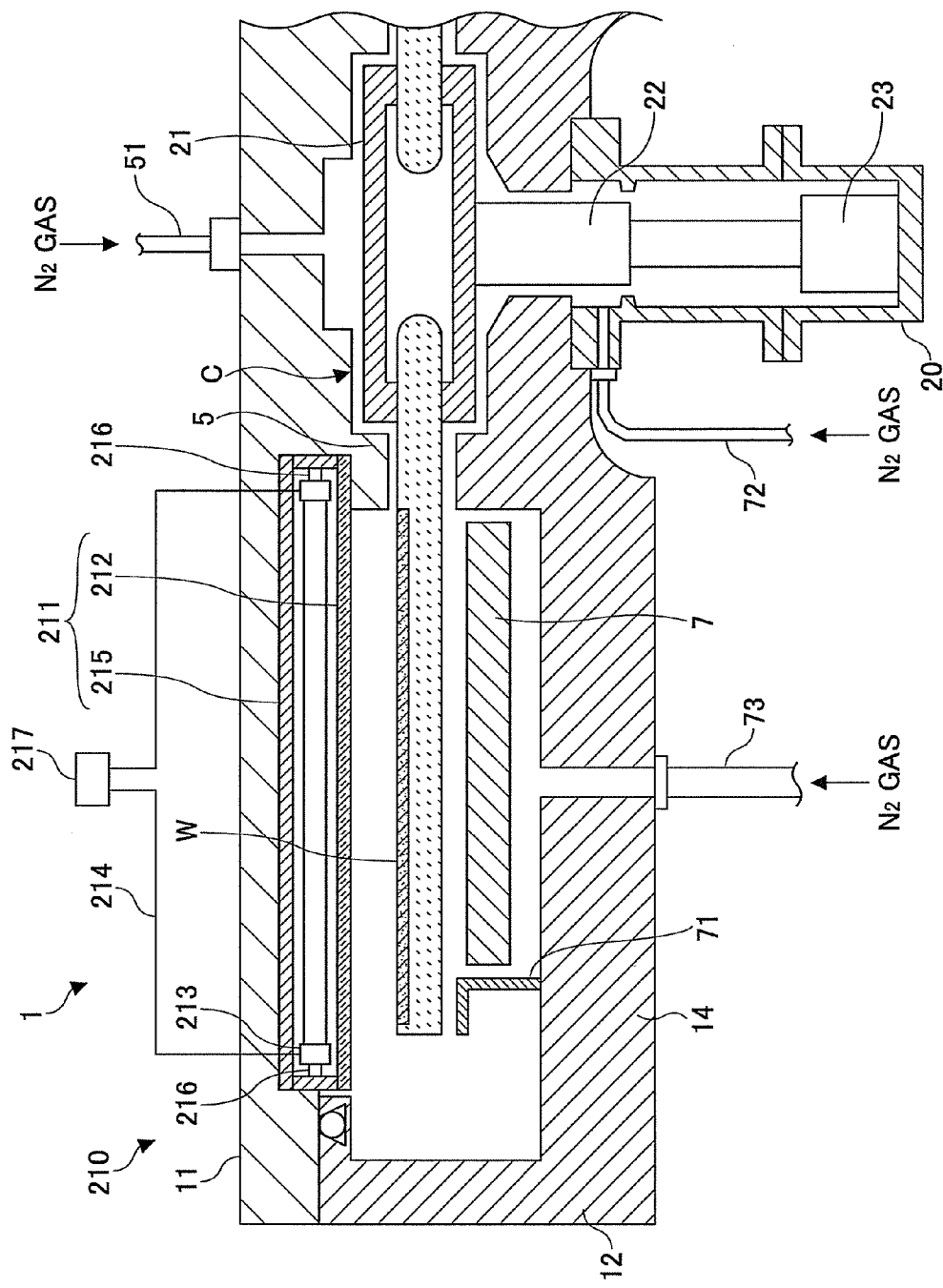
FIG. 6 is an enlarged horizontal cross-sectional view of the film deposition apparatus of FIG. 1.

In addition, a heating lamp 210 serving as a heating unit is arranged to extend along the radius direction of the turntable 2 in an area downstream relative to the second reaction gas nozzle 32 along the rotation direction of the turntable 2 (or between the second reaction gas nozzle 32 and the separation area D provided downstream relative to the second reaction gas nozzle 32 along the rotation direction of the turntable 2). The heating lamp 210 is composed of, for example, an infrared lamp having a bar shape, and provided in a lamp house 211 arranged in the ceiling plate 11 along the radius direction of the turntable 2, as shown in FIG. 6. The lamp house 211 includes a reflector 215 in the upper portion, and a light transmission window 212 in the lower portion in order to hermetically isolate an inner atmosphere of the lamp house 211 and an atmosphere inside the vacuum chamber 11 and to allow the infrared light to go therethrough toward the turntable 2. On both sides of the heating lamp 210, there are sealing members 213, 213 that also serve as electrodes to which feeding wires 214, 214 are respectively connected from the above of the ceiling plate 11. A reference symbol 217 represents a power source for feeding electricity to the heating lamp 210 via the feeding wires 214, 214 and the sealing members 213, 213. Reference symbols 216 are supporting members that support corresponding end portions of the heating lamp 210. In addition, the heating lamp 210 may be controlled in order to heat the wafer W placed on the turntable 2 up to about 100° C. through about 450° C., which may be a preferable temperature range in carrying out a thermal process (densification process) described later, or more preferably 350° C., in accordance with a temperature measured by a temperature detection portion (not shown) such as a thermocouple. Incidentally, the lamp house 211 is omitted in FIG. 2, for the sake of convenience.

When the wafer W having a diameter of about 300 mm is supposed to be processed in the film deposition apparatus according to this example, the convex portion 4 may have a circumferential length (along the circle concentric to the turntable 2) of, for example, about 146 mm along an interfacial position with respect to the protrusion portion 5 at a distance 140 mm from the rotation center of the turntable 2, and a circumferential length of, for example, about 502 mm along an arc corresponding to the widest portion of the concave portion 24 of the turntable 2 in this embodiment. In addition, a circumferential length L from one side wall of the convex portion 4 through the nearest inner wall of the groove portion 43 along the arc is about 246 mm, as shown in the subsection (a) of FIG. 4.

In addition, as shown in the subsection (a) of FIG. 4, the height h of the lower surface of the convex portion 4, namely, the first ceiling surface 44 from the upper surface of the turntable 2 may be 0.5 mm through 10 mm, for example, and is preferably about 4 mm. In this case, the rotation speed of the turntable 2 may be set as, for example, about one rpm through about 500 rpm. In order to allow the separation area D to demonstrate the separation effect, a size of the convex portion 4 and the height h of the lower surface of the convex portion 4 (the first ceiling surface 44) from the turntable 2 may be determined depending on the rotation speed of the turntable 2 and the like, through experimentation. $N_2$ gas is used as the separation gas in this embodiment, but an inert gas such as Ar, $H_2$ or any other gases may be used in other embodiments, as long as the separation gas does not affect the film deposition.

On the other hand, the ring-shaped protrusion portion 5 is provided on the lower surface of the ceiling plate 11 so that the inner circumference surface of the protrusion portion 5 faces the outer circumference surface of the core portion 21. The protrusion portion 5 opposes the turntable 2 in an outer area of the core portion 21. In addition, a lower surface of the protrusion portion 5 and a lower surface (the first ceiling surface 44) of the convex portion 4 form one plane surface. In other words, a height of the lower surface of the protrusion portion 5 from the turntable 2 is the same as the height h of the lower surface of the convex portion 4. The convex portion 4 is formed not integrally with but separately from the protrusion portion 5 in other embodiments. Incidentally, FIGS. 2 and 3 show the inner configuration of the vacuum chamber 1 whose ceiling plate 11 is removed while the convex portions 5 remain inside the vacuum chamber 1.

Figure 7:
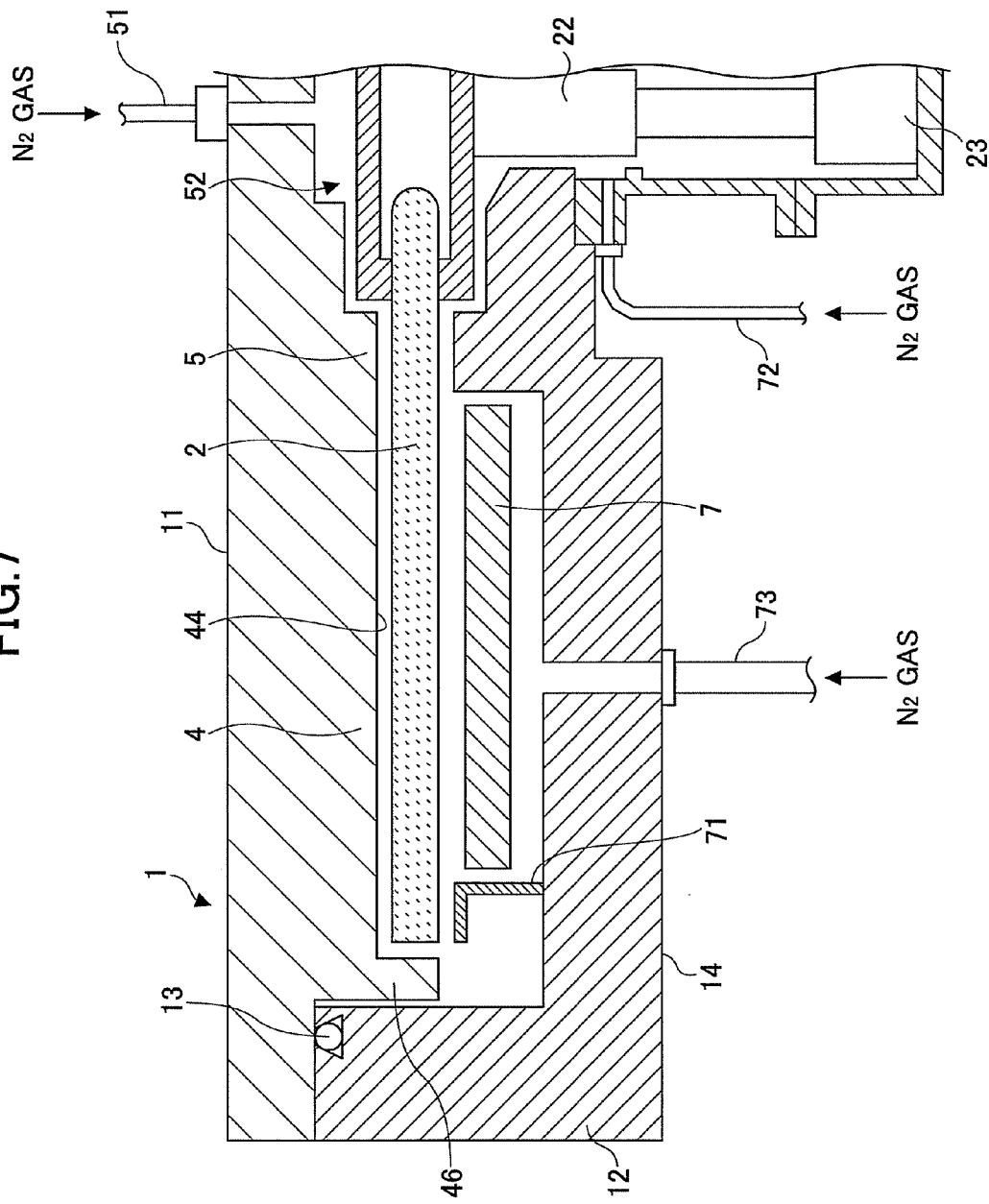
FIG. 7 is another enlarged horizontal cross-sectional view of the film deposition apparatus of FIG. 1.

As described above, the vacuum chamber 1 is provided with the first ceiling surfaces 44 and the second ceiling surfaces 45 higher than the first ceiling surfaces 44, which are alternately arranged in the circumferential direction. FIG. 7 shows a cross section of another portion of the vacuum chamber 1 where the lower first ceiling surface 44 is formed, while FIG. 1 shows a cross section of one portion of the vacuum chamber 1 where the higher ceiling surface 45 is formed. As shown in FIGS. 2 and 7, the convex portion 4 has a bent portion 46 that bends in an L-shape at the outer circumferential edge of the convex portion 4. The bent portion 46 is provided in order to impede the reaction gases from entering from both sides of the bent portion 46 and from being mixed with each other, in the same manner as the protrusion portion 5. The gaps between the bent portion 46 and the turntable 2 and between the bent portion 46 and the chamber body 12 may be the same as the height h of the first ceiling surface 44 from the turntable 2. In the illustrated example, an inner wall of the bent portion 46, the inner wall facing the outer circumferential surface of the turntable 2, serves as an inner circumferential wall of the vacuum chamber 1 (chamber body 12).

The inner circumferential wall of the chamber body 12 is close to the outer circumferential surface of the bent portion 46 and stands upright in the separation area D, as shown in FIG. 7, and is dented outward from a height corresponding to the outer circumferential surface of the turntable 2 down through the bottom portion 14 of the chamber body 12 in areas other than the separation area D, as shown in FIG. 1. This dented area is referred to as an evacuation area E below. A first evacuation port 61 is provided in the bottom portion 14 below the evacuation area E1 (FIG. 1), and a second evacuation port 62 is provided in the bottom portion 14 below the evacuation area E2 (FIG. 3). The first and the second evacuation ports 61, 62 are connected to an evacuation unit 64 including, for example, a vacuum pump via corresponding evacuation pipes 63 including a valve 65, as shown in FIG. 1.

These evacuation ports 61, 62 are arranged on both sides of the separation area D, when being seen from above, in order to facilitate the separation effect demonstrated by the separation area D. Specifically, the first evacuation port 61 is arranged between the first process area 91 and the adjacent separation area D downstream of the rotation direction of the turntable 2 relative to the first process area 91, and the second evacuation port 62 is arranged between the second process area 92 and the adjacent separation area D downstream of the rotation direction of the turntable 2 relative to the second process area 92. The first evacuation port 61 is arranged between the first reaction gas nozzle 31 and the adjacent separation area D downstream relative to the first reaction gas nozzle 31 along the rotation direction of the turntable 2 in order to substantially exclusively evacuate the BTBAS gas ejected from the first reaction gas nozzle 31. The evacuation port 62 is arranged between the second reaction gas nozzle 32 and the adjacent separation area D downstream relative to the second reaction gas nozzle 32 along the rotation direction of the turntable 2 in order to substantially exclusively evacuate the $O_3$ gas and the ethanol gas ejected from the second reaction gas nozzle 32 and the auxiliary gas nozzle 200, respectively. Namely, the first evacuation port 61 is provided between a straight line L1 shown by a chain line in FIG. 3 that extends from the center of the turntable 2 along the first reaction gas nozzle 31 and a straight line L2 shown by a two-dot chain line in FIG. 3 that extends from the center of the turntable 2 along the straight edge on the upstream side of the convex portion 4 concerned. Additionally, the evacuation port 62 is provided between a straight line L3 shown by a chain line in FIG. 3 that extends from the center of the turntable 2 along the second reaction gas nozzle 32 and a straight line L4 shown by a two-dot chain line in FIG. 3 that extends from the center of the turntable 2 along the straight edge on the upstream side of the convex portion 4 concerned.

Although the two evacuation ports 61, 62 are made in the chamber body 12 in this embodiment, three evacuation ports may be provided in other embodiments. For example, an additional evacuation port may be made in an area between the second reaction gas nozzle 32 and the separation area D located upstream of the clockwise rotation direction of the turntable 2 in relation to the second reaction gas nozzle 32. In this case, the additional evacuation port may be arranged between the second reaction gas nozzle 32 and the auxiliary gas nozzle 200. Moreover, an additional separation area may be provided between the second reaction gas nozzle 32 and the auxiliary gas nozzle 200 in order to separately evacuate the ethanol gas and the $O_3$ gas. Furthermore, four or more evacuation ports may be provided.

While the evacuation ports 61, 62 are located below the turntable 2 to evacuate the vacuum chamber 1 through an area between the inner circumferential wall of the chamber body 12 and the outer circumferential surface of the turntable 2 in the illustrated example, the evacuation ports may be located in the side wall of the chamber body 12. When the evacuation ports 61, 62 are provided in the side wall of the chamber body 12, the evacuation ports 61, 62 may be located higher than the turntable 2. In this case, the gases flow along the upper surface of the turntable 2 into the evacuation ports 61, 62 located higher than the turntable 2. Therefore, it is advantageous in that particles in the vacuum chamber 1 are not blown upward by the gases, compared to when the evacuation ports are provided, for example, in the ceiling plate 11.

Figure 8:
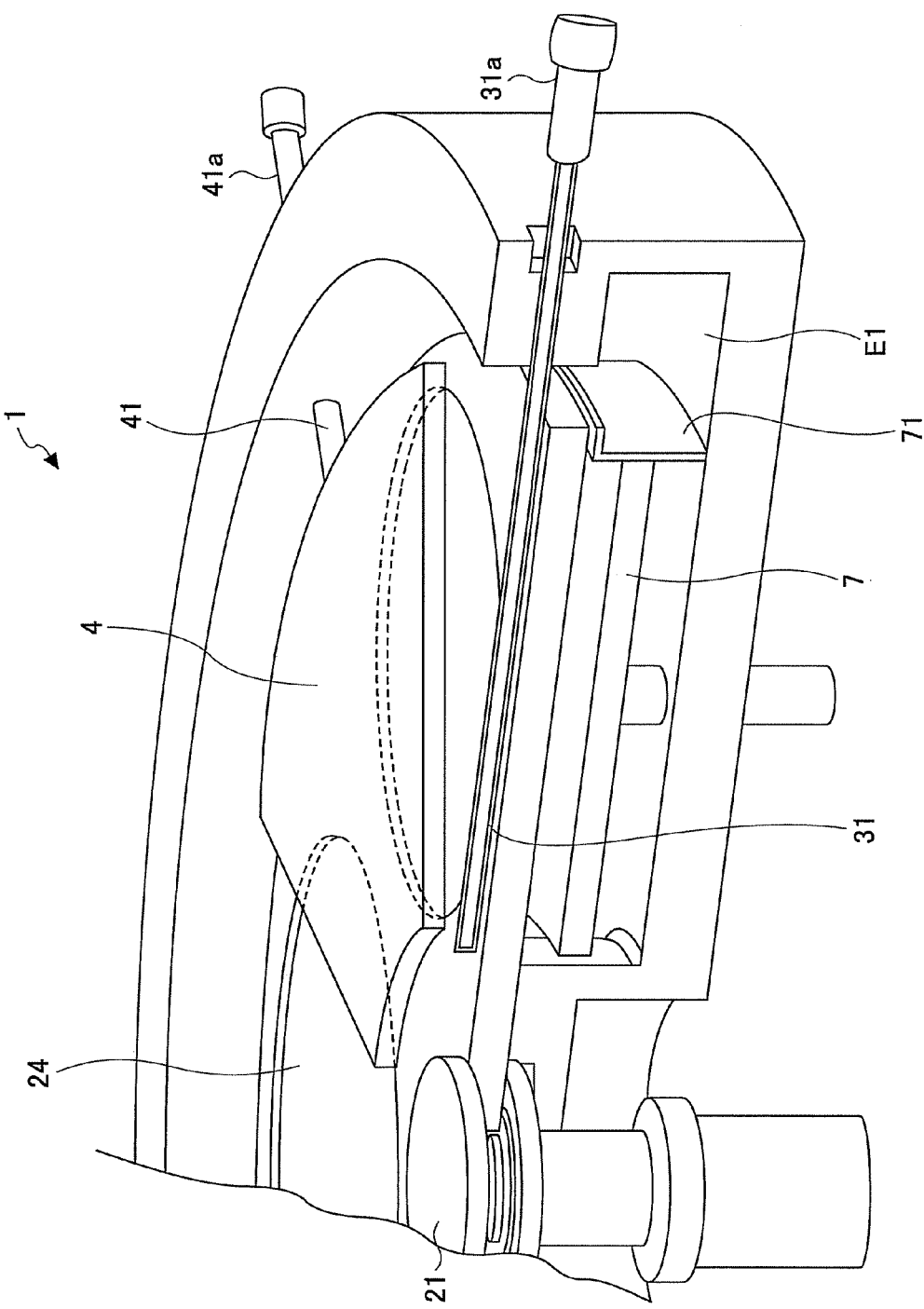
FIG. 8 is a perspective view illustrating a part of the film deposition apparatus of FIG. 1.

Referring to FIGS. 1 and 8, a heater unit 7 is provided in a space between the turntable 2 and the bottom portion 14 of the vacuum chamber 1 in order to heat the turntable 2 and, thus the wafer W on the turntable 2, up to a temperature set by a process recipe. Below the circumferential portion of the turntable 2, a cover member 71 is provided surrounding the heater unit 7 in order to separate an atmosphere of the space where the heater unit 7 is housed (the heater unit housing space) and an atmosphere outside of the heater unit housing space. An upper portion of the cover member 71 is horizontally bent outward in a flange shape, which reduces a gap between the cover member 71 and the lower surface of the turntable 2 in order to impede gases from entering the heater unit housing space from the outside of the space.

Referring to FIG. 1, part of the bottom portion 14, the part being closer to the rotation center of the turntable 2 than the heater unit housing space is arranged, comes close to the core portion 21 and the center area and around of the turntable 2, thereby leaving a narrow space therebetween. In addition, there is a small gap between the rotational shaft 22 and an inner surface of the through hole through which the rotational shaft 22 penetrates. The narrow space is in pressure communication with the inside of the case body 20 through the small gap. A purge gas pipe 72 is connected to be open to the narrow space, thereby supplying a purge gas, for example, $N_2$ gas. Moreover, plural purge gas supplying pipes 73 are connected to the bottom portion 14 of the chamber body 12 below the heater unit 7 along the circumferential direction in order to purge the heater unit housing space with, for example, $N_2$ gas.

Figure 9:
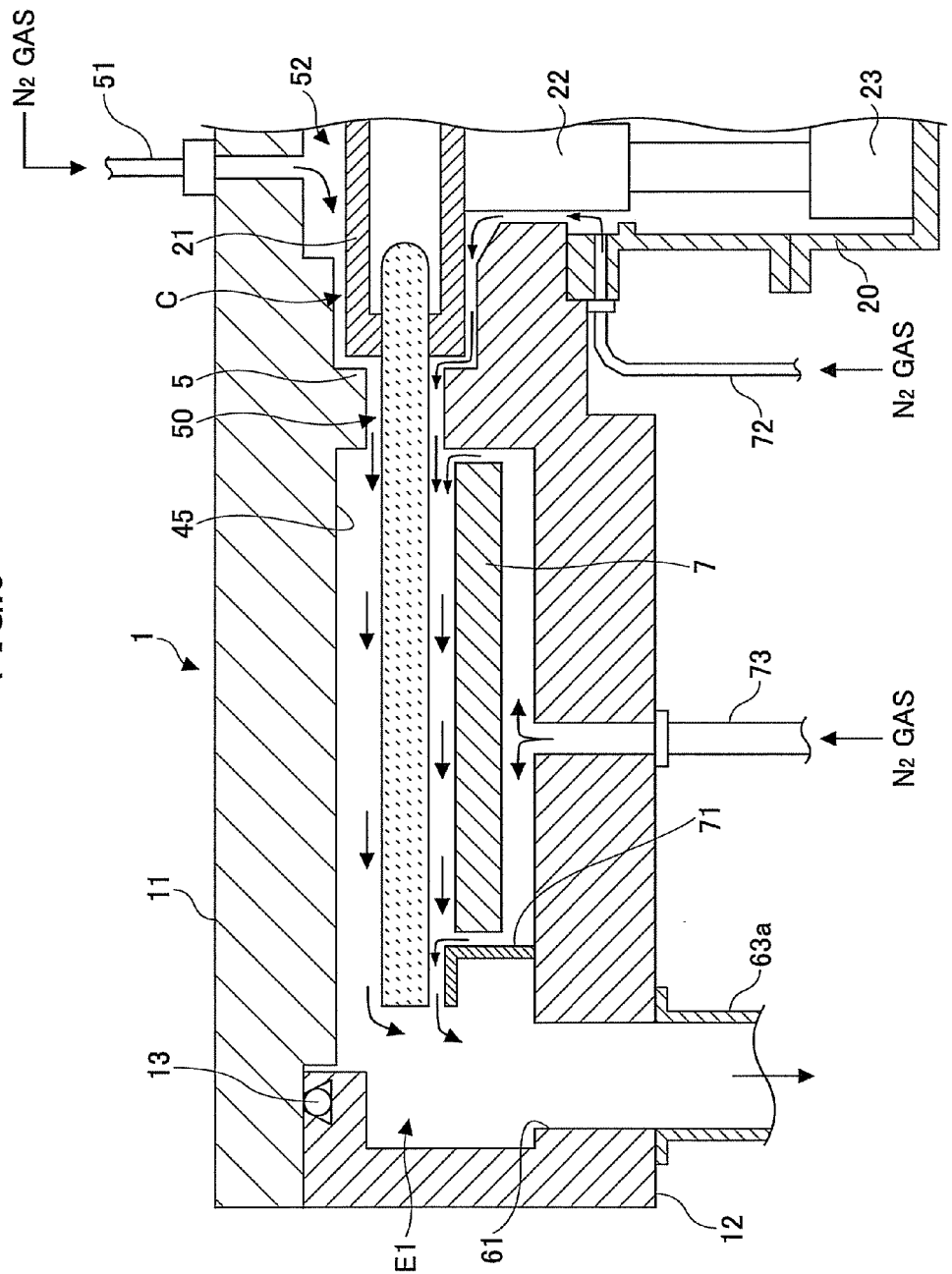
FIG. 9 is a schematic view illustrating a gas flow pattern in the film deposition apparatus of FIG. 1.

With the purge gas supplying pipes 72, 73 provided in the above manner, the space extending from the case body 20 through the heater unit housing space 75 is purged with $N_2$ gas as shown by arrows in FIG. 9. The purge gas is evacuated from the evacuation ports 61, 62 through a gap between the turntable 2 and the cover member 71, and through the evacuation areas E1, E2. With this, the BTBAS gas does not flow into the second process area 92 via the space below the turntable 2. Namely, because this purge gas serves as another separation gas, the $O_3$ gas and the ethanol gas do not flow into the first process area 91 via the space below the turntable 2. Namely, this purge gas serves as another separation gas.

Referring to FIG. 9, a separation gas supplying pipe 51 is connected to the top center portion of the ceiling plate 11 of the vacuum chamber 1, so that $N_2$ gas is supplied as a separation gas to a space 52 between the ceiling plate 11 and the core portion 21. The separation gas supplied to the space 52 flows through a thin gap 50 between the protrusion portion 5 and the turntable 2 and then along the top surface of the turntable 2, and reaches the evacuation areas E1, E2. Because the space 52 and the gap 50, are filled with the $N_2$ gas, the reaction gases (BTBAS, $O_3$, ethanol) cannot be mixed through the center portion of the turntable 2. In other words, the film deposition apparatus according to this embodiment is provided with a center area C that is defined by the center portion of the turntable 2 and the vacuum chamber 1 in order to isolate the first process area 91 and the second process area 92 and is configured to have an ejection opening that ejects the separation gas toward the top surface of the turntable 2. The ejection opening corresponds to the gap 50 between the protrusion portion 5 and the turntable 2, in the illustrated example.

Figure 10:
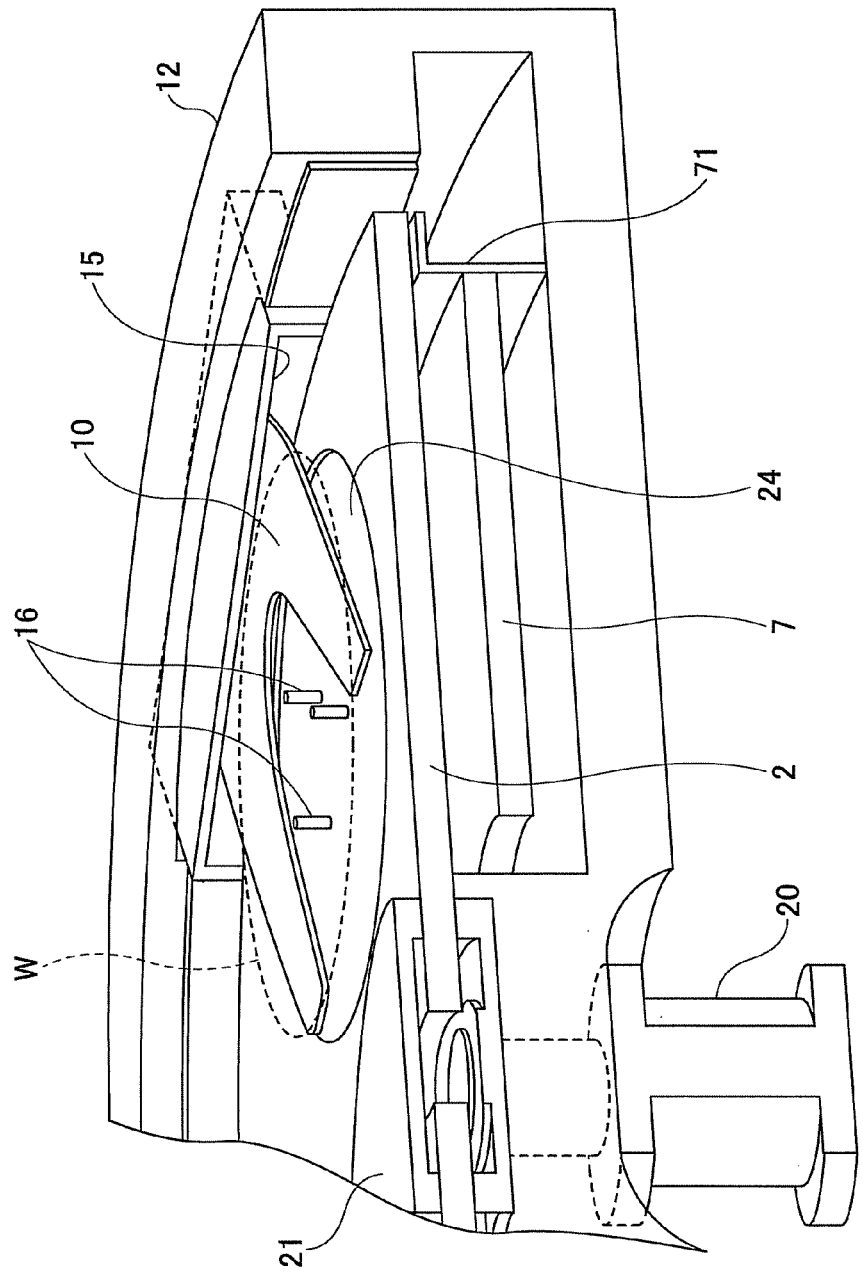
FIG. 10 is a partly broken perspective view of the film deposition apparatus of FIG. 1.

In addition, the transfer opening 15 is formed in a side wall of the chamber body 12 as shown in FIGS. 2, 3 and 10. Through the transfer opening 15, the wafer W is transferred into or out from the vacuum chamber 1 by a transfer arm 10 (FIGS. 3 and 10). The transfer opening 15 is provided with a gate valve (not shown) by which the transfer opening 15 is opened or closed. When the concave portion 24 of the turntable 2 is in alignment with the transfer opening 15 and the gate valve is opened, the wafer W is transferred into the vacuum chamber 1 and placed in the concave portion 24 as a wafer receiving portion of the turntable 2 from the transfer arm 10. In order to lower/raise the wafer W into/from the concave portion 24, there are provided the elevation pins 16 that are raised or lowered through corresponding through holes formed in the concave portion 24 of the turntable 2 by an elevation mechanism (not shown).

In addition, the film deposition apparatus according to this embodiment is provided with a control portion 80 that controls total operations of the deposition apparatus. The control portion 80 includes a central processing unit (CPU), a memory, and process programs. The memory includes tables of process conditions containing flow rates of the BTBAS gas, the $O_3$ gas, the ethanol gas, and the $N_2$ gas, an inner (process) pressure inside the vacuum chamber 1, currents supplied to the heater unit 7 and the heating lamp 210 (or a temperature of the wafer W) corresponding to process recipes. The process programs include instruction steps that cause the film deposition apparatus to operate by referring to the process recipes and outputting control signals accordingly to various components or parts of the film deposition apparatus. The process program is stored in a storage portion 85 that is a computer readable storage medium such as a hard disk, a compact disk, a magneto optical disk, a memory card, a flexible disk, or the like, and installed into the control portion 80.

Figure 11:
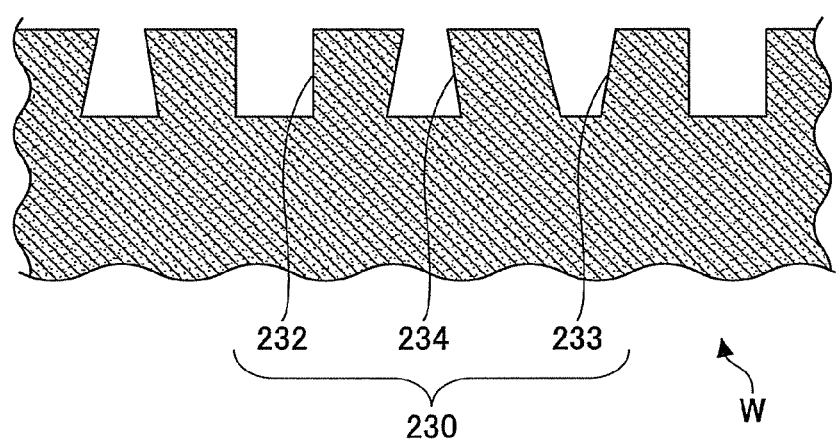
FIG. 11 is a schematic vertical cross-sectional view of a substrate that is to undergo a film deposition process carried out in the film deposition apparatus of FIG. 1.

Next, operations of the film deposition apparatus according to this embodiment of the present invention are described with reference to FIGS. 11 through 14. First, the wafer W on which a film is deposited in the film deposition apparatus is explained. On an upper surface of the wafer W, there are formed plural groove-like concave portions 230 extending in parallel with one another. FIG. 11 is a schematic cross-sectional view illustrating the concave portions 230 formed in the upper surface of the wafer W. An aspect ratio of the concave portions 230 is about 3 through about 50. The concave portions (patterns) 230 are to be filled with silicon oxide serving as a Shallow Trench Isolation (STI), for example, which is formed in an upper surface of a silicon wafer. Such patterns are formed by a photolithography technology using a photomask layer provided on the upper surface of the silicon wafer. Generally, the concave portions 230 may include a rectangular concave portion 232 having a rectangular cross-sectional shape, a taper portion 233 having a tapered cross-sectional shape, and a reverse-tapered portion 234 having a reverse-tapered cross sectional shape, as shown in FIG. 11, due to process variability. Incidentally, the cross-sectional shapes are exaggeratingly illustrated in FIG. 11.

The wafer W having the concave portions 230 is transferred into the vacuum chamber 1 in the following manner. First, the turntable 2 is rotated so that the concave portion 24 is in alignment with the transfer opening 15, and the gate valve (not shown) is open. Second, the wafer W is brought into the vacuum chamber 1 through the transfer opening 15 by the transfer arm 10. The wafer W is received by the elevation pins 16 and lowered to the concave portion 24 by the elevation pins 16 driven by the elevation mechanism (not shown) after the transfer arm 10 is pulled away from the vacuum chamber 1. Then, the series of the above procedures are repeated five times, and thus five wafers W are loaded on the turntable 2. Next, the turntable 2 is rotated in a clockwise direction at a rotation speed of 240 rpm, and the vacuum chamber 1 is fully evacuated through the fully-opened valve 65 (FIG. 1). The wafers W are heated to a predetermined temperature (e.g., 350° C.) by the heater unit 7. In addition, the heating lamp 210 is energized so that the upper surface of the wafer W that passes below the heating lamp is heated at, for example, 350° C.

Next, the $N_2$ gas is supplied from the separation gas nozzles 41, 42 to the vacuum chamber 1 at flow rates of, for example, 10000 standard cubic centimeters per minute (sccm), and from the separation gas supplying pipe 51 and the purge gas supplying pipe 72 at predetermined flow rates. By controlling the valve 65 (FIG. 1), the inner pressure of the vacuum chamber 1 is maintained at a predetermined pressure. Then, the BTBAS gas and the $O_3$ gas are supplied into the vacuum chamber 1 from the first reaction gas nozzle 31 and the second reaction gas nozzle 32 at flow rates of, for example, 200 sccm and 10000 sccm, respectively. In addition, the ethanol gas is supplied from the auxiliary gas nozzle 200 to the vacuum chamber 1 at a predetermined flow rate of, for example, 100 sccm.

Figure 12:
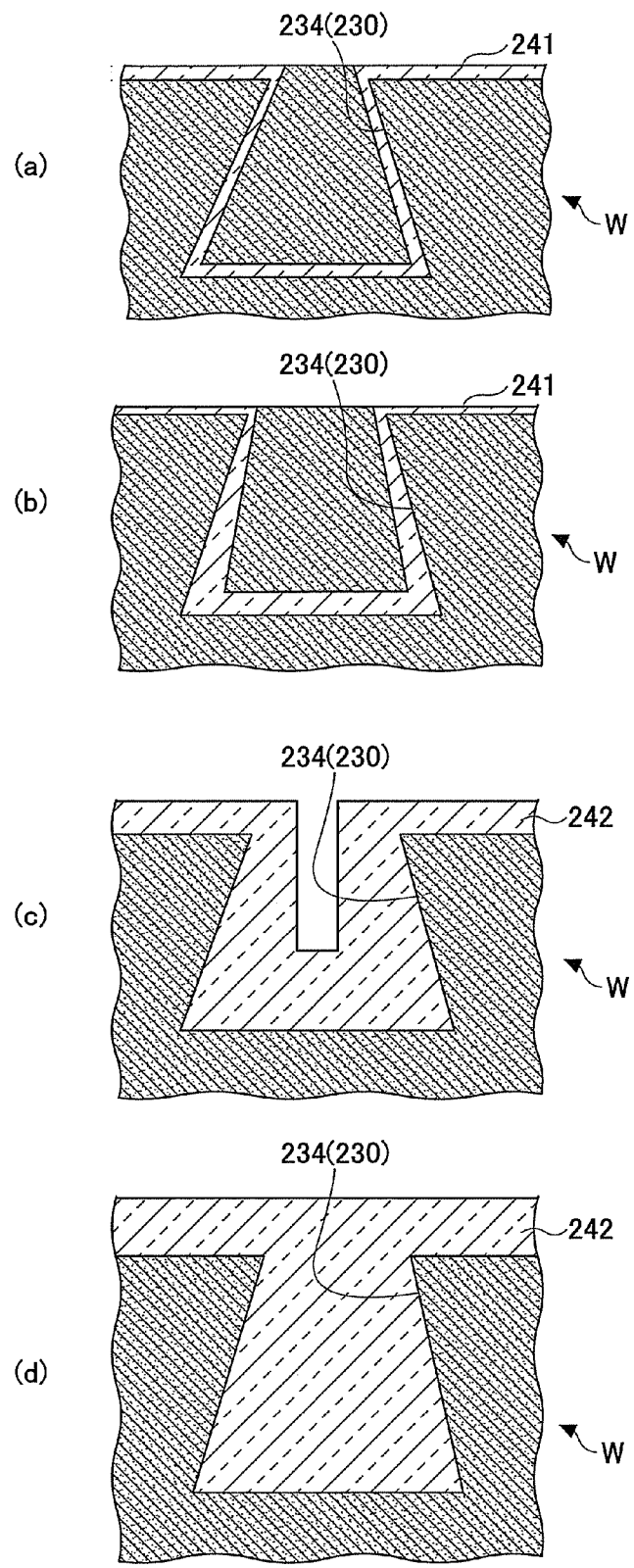
FIG. 12 is schematic vertical cross-sectional views of the substrate, where a concave portion in the substrate is being filled.
Figure 13:
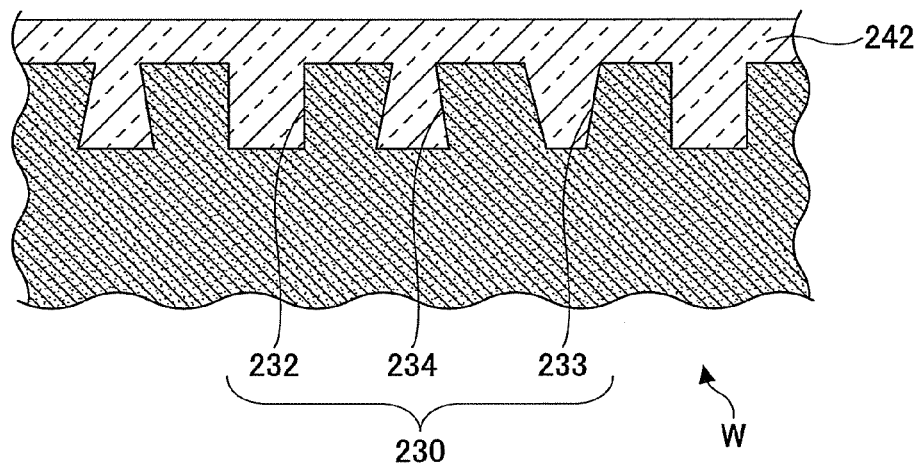
FIG. 13 is a schematic vertical cross-sectional view of the substrate after the film deposition process.

The wafers W in the turntable 2 pass through the first process area 91, the auxiliary area 90, and the second process area 92 in this order due to rotation of the turntable 2. When the wafer W passes through the first process area 91 below the first reaction gas nozzle 31, one or more layers of BTBAS molecules is adsorbed on the surface of the wafer W. FIG. 12 schematically illustrates the concave portion 230 that is being filled with silicon oxide, in an exaggerating manner. Next, when the wafer W passes through the auxiliary area 90, the molecular layer(s) of the BTBAS gas is reacted with the ethanol gas supplied from the auxiliary gas nozzle 200, in accordance with the following chemical formula.

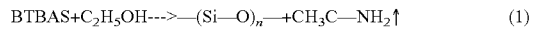

$$BTBAS+C_2H_5OH \longrightarrow -(Si-O)_n- + CH_3C-NH_2\uparrow \qquad (1)$$

Namely, the BTBAS is silanolized, and thus t-butylamine ($CH_3C-NH_2$) and siloxane polymer as an intermediate product ($-(Si-O)_n-$) are produced.

The siloxane polymer is a cluster-like substance, not firmly adsorbed on the wafer W, and has a higher viscosity, which allows the siloxane polymer to reflow on the upper surface of the wafer W. Therefore, the siloxane polymer can reflow due to gravity applied thereon, so that the siloxane polymer deposited on an inner wall of the concave portion 230 becomes thicker toward the bottom of the concave portion 230, as shown in a subsection (b) of FIG. 12. As a result, the inner wall in the reverse-tapered portion 234 becomes upright, or the width of the reverse-tapered portion 234 becomes constant through its height. In addition, the organic products produced at the same time as the siloxane polymer are evaporated and evacuated above the wafer W.

Then, when the wafer W passes through the second process area 92, the siloxane polymer on the upper surface W and in the concave portion 230 is oxidized by the $O_3$ gas supplied from the second gas nozzle 32, and thus a silicon oxide film 242 having a thickness of about 0.1 nm is produced. Organic materials produced at the same time as the silicon oxide film 242 are evaporated and evacuated above the wafer W. The silicon oxide film 242 produced in such a manner has reflowability, if only a little, because the siloxane polymer has a relatively higher reflowability. Next, when the wafer W passes through an area below the heating lamp 210 right after the wafer W passes through the second process area 92, the upper surface of the wafer W is immediately heated up to about 350° C., even though the wafer W leaves the area below the heating lamp 210 in a short period of time. As a result, the Si—OH bonds in the silicon oxide film 242 are matured into Si—O bonds, so that the silicon oxide film 242 is thermally cured and becomes densified. Then, when the wafer W leaves the area below the heating lamp 210 to the downstream side of the area, the wafer W is slightly cooled by the $N_2$ gas supplied toward the upper surface of the wafer W in the separation area D, so that the silicon oxide film 242 becomes solidified, leaving an almost upright wall in the concave portion 234.

In addition, because the wafer W is heated by the heating lamp 210, even if there remain organic impurities in the silicon oxide film 242, such organic impurities are evaporated and evacuated from the silicon oxide film.

In the above-explained manner, production of the molecular layer(s) 241, production and reflow of the siloxane polymer, production and reflow of the reaction product (silicon oxide film 242), and densification of the silicon oxide film 242 are repeated, for example, 20 cycles by rotating the turntable 2. As a result, the inner wall becomes upright in the concave portion 234 as shown in a subsection (c) of FIG. 12, and finally the concave portion 234 is filled with silicon oxide. The silicon oxide film 242 is formed through the silanolization of the BTBAS and reflow of the siloxane polymer in each cycle, so that the inner wall gradually becomes upright. Therefore, the concave portion 234 can be substantially fully filled without voids. In addition, even when the impurities remain in the silicon oxide film 242, the impurities can be immediately evaporated and evacuated because a thickness of the silicon oxide film 242 is relatively small in each cycle.

Figure 14:
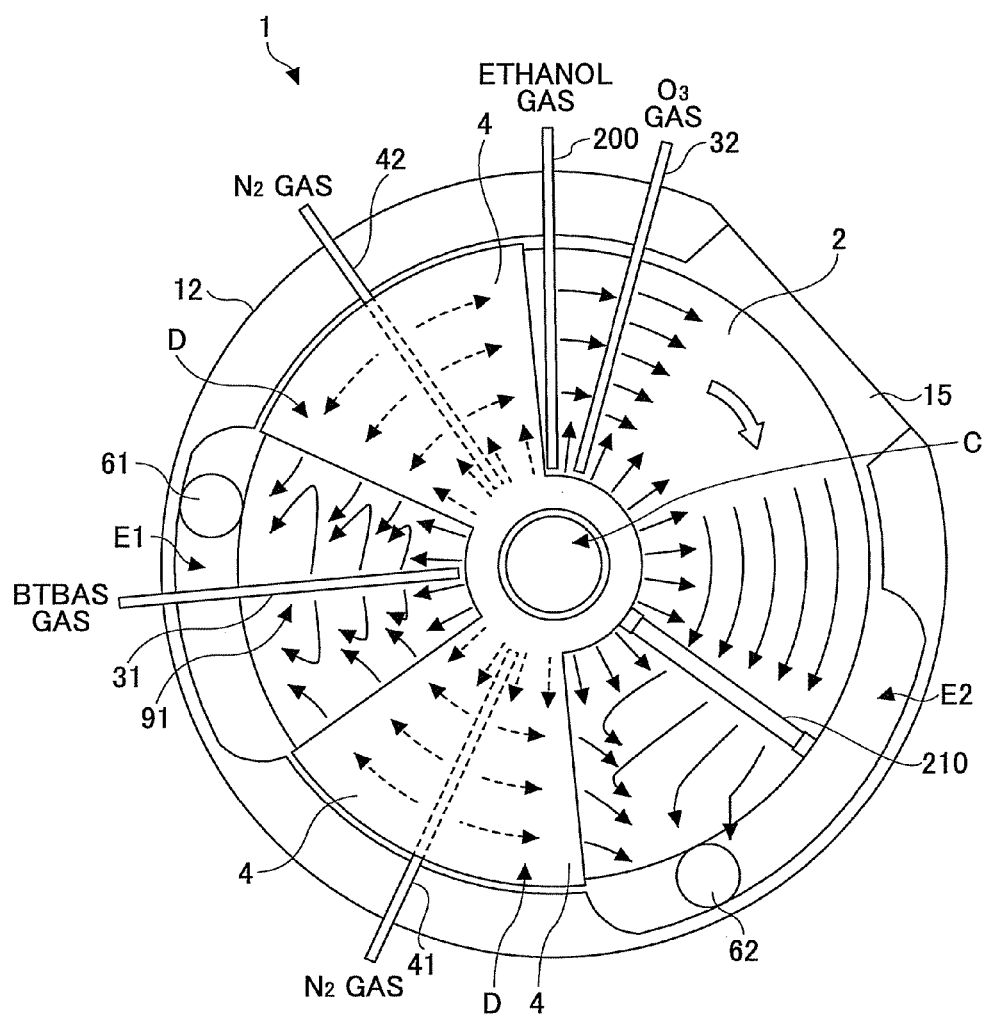
FIG. 14 is a schematic view illustrating a gas flow pattern in the film deposition apparatus of FIG. 1.

In a series of the above procedures, the $N_2$ gas is supplied in the separation area D between the first process area 91 and the auxiliary area 90 and the separation area D between the first process area 91 and the second process area 92. In addition, the $N_2$ gas is supplied from the center area C. Therefore, the BTBAS gas is evacuated from the vacuum chamber 1 without being intermixed with the $O_3$ gas and the ethanol gas, as shown in FIG. 14. Moreover, the BTBAS gas is impeded from being intermixed with the $O_3$ gas and the ethanol gas through an area between the outer circumference of the turntable 2 and the inner circumferential wall of the chamber body 12, because there is only a narrow gap between the bent portion 46 and the outer circumference of the turntable 2. Therefore, an atmosphere of the first process area 91 is substantially completely separated from atmospheres of the second process area 92 and the auxiliary area 90, and the BTBAS gas is evacuated through the first evacuation port 61, while the $O_3$ gas and the ethanol gas are evacuated through the second evacuation port 62. As a result, the BTBAS gas is not intermixed with the $O_3$ gas and the ethanol gas in an inner atmosphere of the vacuum chamber 1.

In addition, because the evacuation ports 61, 62 are arranged below the corresponding evacuation areas E1, E2 that are in gaseous communication with the space below the higher second ceiling surface 45, a pressure in the space below the higher ceiling surface 45 is smaller than the thin area below the lower first ceiling surface 44 and the center area C. This is partly because the thin space is provided so that the height h can maintain the pressure difference between the thin space and the place where the first reaction gas nozzle 31 (32) or the first (the second) process area 91 (92) is located.

In addition, because the space below the turntable 2 is purged by the $N_2$ gas, the BTBAS gas cannot flow through below the turntable 2 into the second process area 92.

Incidentally, because the wafers W are placed in the corresponding concave portions 24 and pass through the areas 91, 90, 92 by rotation of the turntable 2, the wafer W may be exposed to the ethanol gas before the molecular layer(s) 241 is produced, or heated by the heating lamp 210. However, such exposures of the wafer W to the ethanol gas and the heat from the heating lamp 210 do not adversely affect the film deposition.

When film deposition is completed in the above-described manner, the wafers W are transferred out from the vacuum chamber 1 by the transfer arm 10 in accordance with procedures opposite to those when the wafers W are transferred into the vacuum chamber 1.

Incidentally, in the above film deposition process, a rotation speed of the turntable 2 may be, for example, one through 500 rpm when the wafer W having a diameter of 300 mm is used; and a flow rate of the $N_2$ gas supplied from the separation gas supplying pipe 51 at the center of the vacuum chamber 1 may be, for example, about 5000 sccm.

According to this embodiment of the present invention, when the two reaction gases (BTBAS, and $O_3$) are alternately supplied to the wafer W having the concave portions 230 to deposit a thin film (silicon oxide), the molecular layer(s) 241 of the BTBAS is formed on the wafer W, and then the molecular layer(s) 241 is silanolized into the siloxane polymer having a higher reflowability by supplying the ethanol gas. The siloxane polymer reflows and the silicon oxide film 242 into which the siloxane polymer is oxidized by the $O_3$ gas also reflows, so that the concave portions 230 are filled with silicon oxide without voids even if the concave portions 230 have a reverse-tapered cross-sectional shape, thereby providing a better gap-filling capability.

In addition, according to this film deposition method of this embodiment, the molecular layer(s) 241 of the BTBAS, the siloxane polymer, and the silicon oxide film 242 that are alternately formed on the upper surface of the wafer W have a relatively small thickness. Therefore, the siloxane polymer and the silicon oxide films 242 can immediately reflow, even when rotation speed of the turntable 2 is increased to several hundreds rpm, which contributes to fabrication of semiconductor devices having the STI structure without voids at higher throughput.

In addition, even if impurities are included in the molecular layer(s) 241 of the BTBAS before silanolization, those impurities can be evaporated and evacuated from the silicon oxide film 242 that is heated by the heating lamp 210 because the silicon oxide film 242 that is formed every cycle is thin.

Moreover, the wafers W can alternatively pass through the areas 91, 90, 92 by rotation of the turntable 2 because the wafers W are arranged along the rotation direction of and on the turntable 2, which leads to a high throughput film deposition. Furthermore, because the film deposition apparatus has the separation areas D including the low first ceiling surface 44 between the first process area 91 and a combination of the auxiliary area 90 and the second process area 92, and the separation gas is ejected from the center portion C defined by the rotation center of the turntable 2 and the vacuum chamber 1, and the reaction gases are evacuated, along with the separation gas spreading on both sides of the separation area D from the separation gas nozzle and the separation gas ejected from the center area C, through the gap between the circumferential edge of the turntable 2 and the inner circumferential wall of the chamber body 12, the reaction gases are impeded from being intermixed with each other, thereby preferably realizing the ALD mode film deposition. Moreover, because the reaction gases are not intermixed, almost no deposits are made from the reaction gases on the turntable 2, thereby reducing particle problems. Incidentally, while the turntable 2 has five concave portions 24 in this embodiment, the turntable 2 may have only one concave portion 24.

While the reaction product is heated by the heating lamp 210 every rotation of the turntable 2 in the above example, the reaction product may be heated by the heating lamp 210 after, for example, 20 cycles of the BTBAS gas adsorption, the intermediate product generation, and the production of the silicon oxide film 242.

In this case, after the turntable 2 is rotated plural times to deposit plural layers of the reaction product on the wafer W, the supply of the reaction gases, except for the separation gas, is stopped, the heating lamp 210 is turned on, and the turntable 2 is rotated one rotation, for example, in order to allow the wafer W to pass through the space below the heating lamp 210. With this, the reaction product can stay reflowable for a relatively longer time before being densified, thereby providing an excellent gap-filling capability. In addition, because the reaction product can be densified by rotating the turntable 2 one rotation, high throughput is maintained.

Moreover, after a cycle of the BTBAS gas adsorption and the production of the silicon oxide film 242 is carried out without supplying the ethanol gas for producing the intermediate product, the silicon oxide film 242 may be exposed to the ethanol gas without supplying the BTBAS gas and the $O_3$ gas, while the heating lamp 210 is turned on.

Second Embodiment

Figure 15:
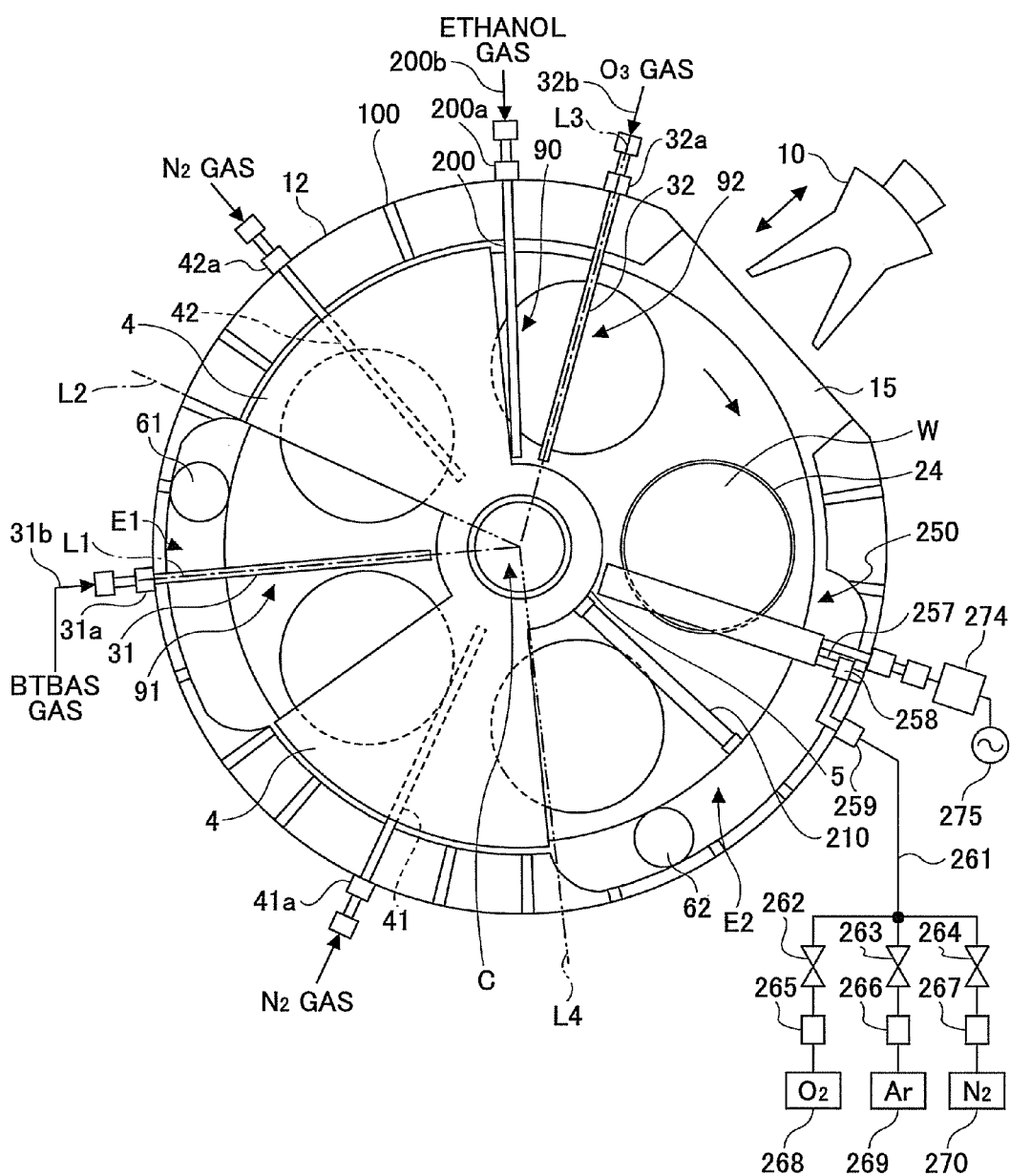
FIG. 15 is a horizontal cross-sectional view illustrating a film deposition apparatus according to another embodiment of the present invention.

Next, a film deposition apparatus according to a second embodiment of the present invention is explained with reference to FIGS. 15 through 17. In the film deposition apparatus, a plasma injector 250 serving as a plasma generating portion is provided between the second reaction gas nozzle 32 and the heating lamp 210 along the rotation direction of the turntable 2, as shown in FIG. 15.

A plasma injector 250 includes an injector body 251 serving as a chassis. Referring to FIGS. 16 and 17, the injector body 251 is divided into two spaces having different widths by an isolation wall 252 extending along a longitudinal direction of the injector body 251. One of the two spaces is a gas activation chamber 253 serving as a gas activation passage where a gas for generating plasma is activated into plasma, and the other one of the spaces is a gas introduction chamber 254 serving as a gas introduction passage from which the gas for generating plasma is introduced into the gas activation chamber 253.

Figure 16:
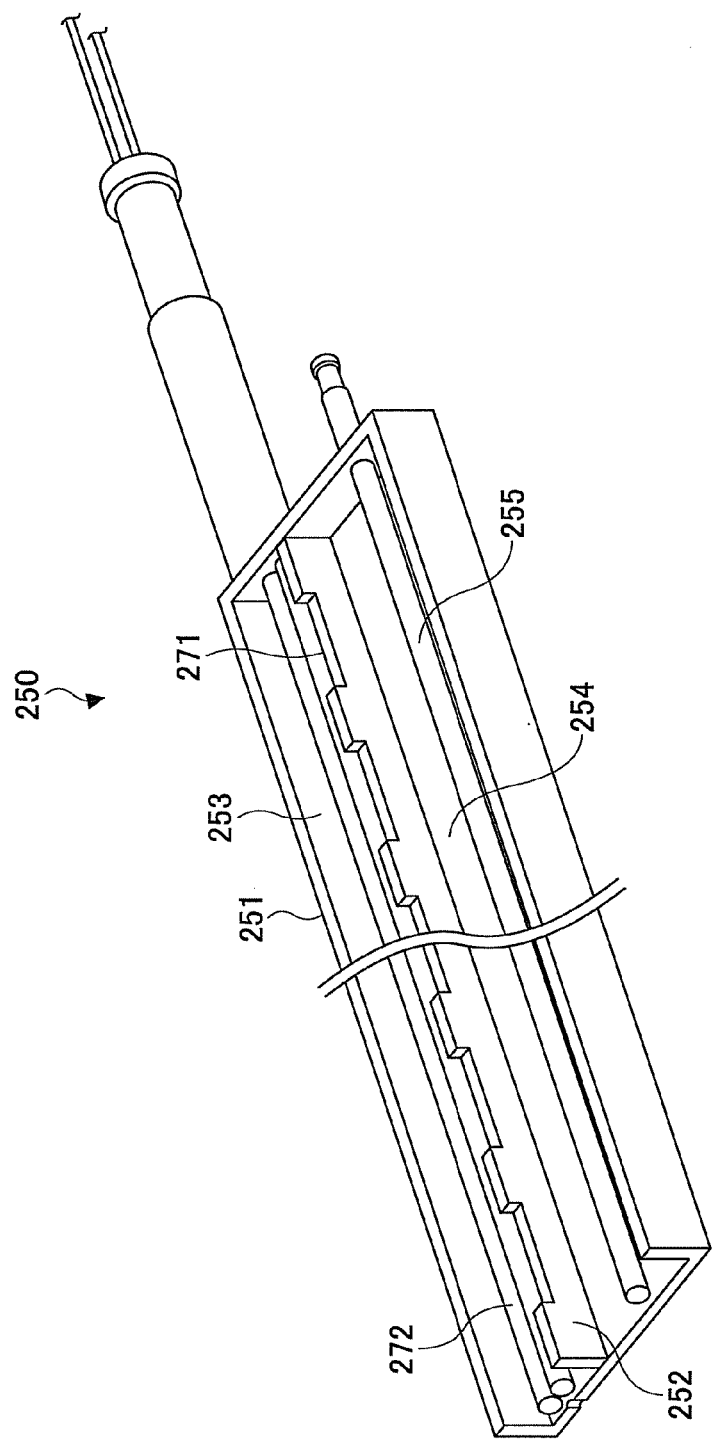
FIG. 16 is a perspective view of an example of a plasma injector in the film deposition apparatus according to the another embodiment.
Figure 17:
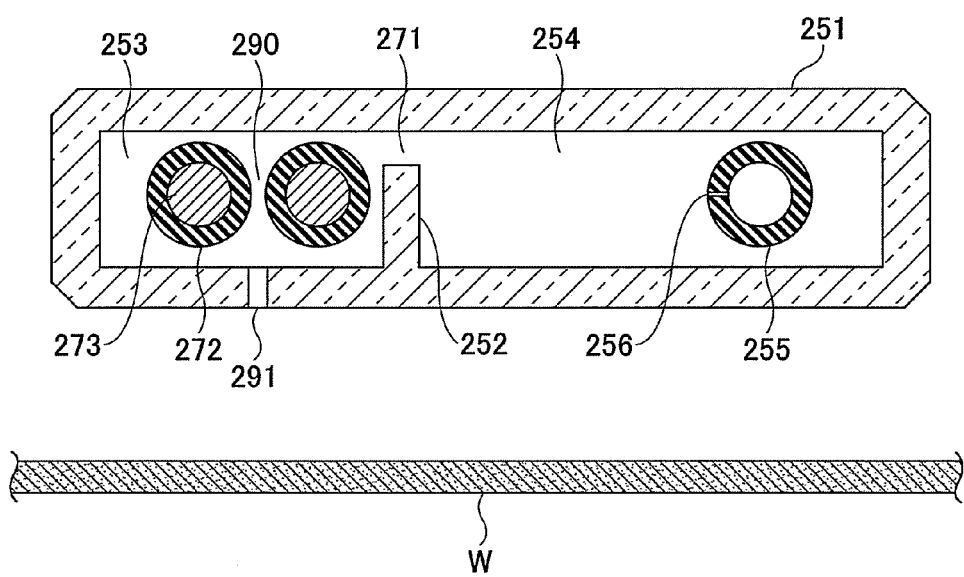
FIG. 17 is a vertical cross-sectional view of the plasma injector of FIG. 17.

In FIGS. 16 and 17, a reference symbol 255 represents a gas introduction nozzle; a reference symbol 256 represents a gas hole; a reference symbol 258 is a joint; and a reference symbol 259 represents a gas supplying port. The gas for generating plasma is supplied to the gas introduction chamber 254 through the gas holes 256 of the gas introduction nozzle 255, and further to the gas activation chamber 253 through a cut-out portion 271 formed in an upper portion of the isolation wall 252. In the gas activation chamber 253, two sheath pipes 272, 272 made of a dielectric material such as a ceramic material extend from a base end of the gas activation chamber 253 toward a distal end of the activation chamber 253. Rod electrodes 273, 273 are inserted into the sheath pipes 272, 272. A distal end portion of each of the rod electrodes 273, 273 is lead out from the injector body 251 and connected to a high frequency power source 275 via a matching box 274 in the outside of the vacuum chamber 1. In a bottom portion of the injector body 251, plural gas ejection holes 291 for ejecting the gas activated into plasma downward are arranged along the longitudinal direction of the injector body 251. The injector body 251 is arranged to extend toward the center portion of the turntable 2. In FIG. 15, reference symbols 262 through 264 represent valves; reference symbols 265 through 267 represent flow rate controllers; and reference symbols 268 through 270 represent gas supply sources of oxygen ($O_2$) gas, argon (Ar) gas, and nitrogen ($N_2$) gas, respectively.

Operations of the film deposition apparatus according to this embodiment are explained in the following. Also in this embodiment, five wafers W are placed on the turntable 2 and the turntable 2 is rotated, while the BTBAS gas, the $O_3$ gas, the ethanol gas, and the nitrogen gas are ejected toward the wafers W on the turntable 2. In addition, the nitrogen gas is supplied to the center area C and the heater unit housing space; and the heater unit 7 and the heating lamp 201 are energized. The Ar gas is supplied to the plasma injector 250 and then high frequency power is supplied to a plasma generation portion 290, which is a space between the rod electrodes 273, 273, of the plasma injector 250 from the high frequency power source 275.

Because the inside of the vacuum chamber 1 is maintained at a reduced pressure so that the plasma can be generated, the gas for generating plasma that has flowed into the gas activation chamber 253 is activated by the high frequency power into plasma, and the plasma is supplied toward the wafers W through the gas ejection holes 291 of the plasma injector 250.

When the above-explained silicon oxide film 242 produced on the wafer W reaches a space below the plasma injector 250 after passing through the second process area 92, the silicon oxide film 242 is exposed to the plasma from the plasma injector 250. With this, carbon elements and moisture remaining in the silicon oxide film 242 are facilitated to be evaporated and evacuated, or chemical bonds between the silicon atoms and the oxide atoms are strengthened. Then, when the wafer W passes through the space below the heating lamp 210, the silicon oxide film 242 becomes densified, and the concave portions 203 are filled with the silicon oxide film 242 without voids.

According to the plasma injector 250, the silicon oxide film 242 having a lower content of impurities and a higher bonding strength can be deposited on the wafers W having the concave portions 230.

Although the Ar gas is used as the gas for generating plasma in this embodiment, the $O_2$ gas and/or the $N_2$ gas may be used as the gas for generating plasma, in the place of or in addition to the Ar gas. The Ar gas as the gas for generating plasma is advantageous in that the Ar gas can facilitate formation of the Si—$O_2$ bonds in the silicon oxide film, reducing the Si—OH bonds. The $O_2$ gas as the gas for generating plasma is advantageous in that the $O_2$ gas can facilitate reaction of unreacted BTBAS molecules adsorbed on the wafer W with oxygen, reducing carbon contents in the silicon oxide film, thereby improving an electrical property of the silicon oxide film.

Also in this embodiment, after plural cycles of adsorption of the BTBAS gas, production of the intermediate product, and production of the silicon oxide film 242 are repeated, the silicon oxide film 242 may be heated by energizing the heating lamp 210. In addition, the plasma is supplied to the wafer W after plural layers of the silicon oxide film 242 are deposited.

Third Embodiment

Figure 18:
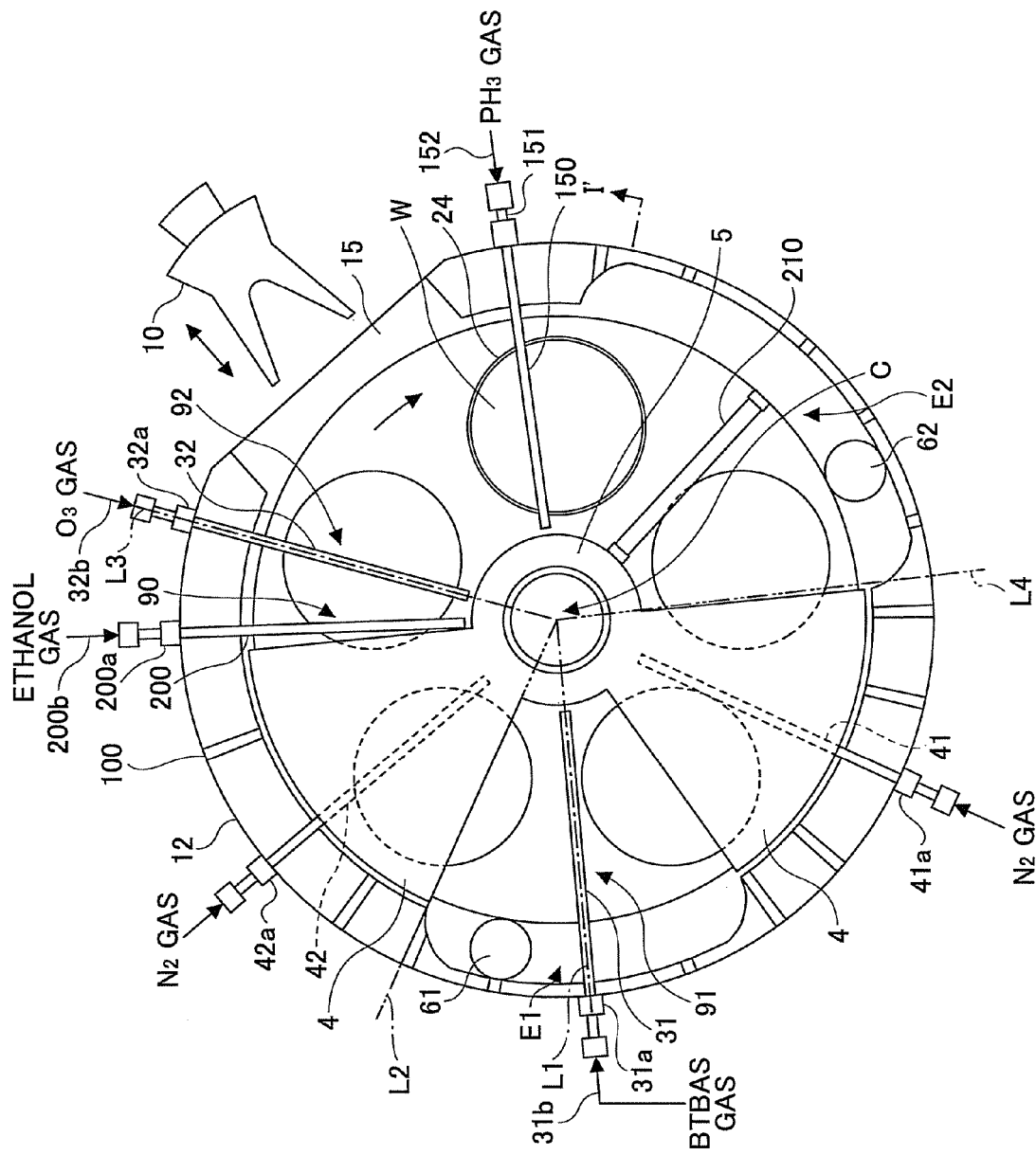
FIG. 18 is a plan view of the film deposition apparatus according to the another embodiment.

Next, a film deposition apparatus according to a third embodiment of the present invention is explained with reference to FIG. 18. In this embodiment, at least one of boron (B) and phosphor (P) is doped as a dopant with the silicon oxide film 242 in order to facilitate reflow of the silicon oxide film 242. Specifically, the film deposition apparatus according to this embodiment can be realized by providing, for example, the film deposition apparatus according to the first embodiment with a third gas nozzle (third reaction gas supplying portion) 150 for supplying, for example, phosphine ($PH_3$) gas as a phosphorous doping gas (third reaction gas). The third gas nozzle 150 may be made of, for example, quartz, and is arranged between the second reaction gas nozzle 32 and the heating lamp 210 in this embodiment.

The third gas nozzle 150 has substantially the same configuration as the gas nozzles 31, 32, 200, 41, 42 and is arranged to horizontally extend from the circumferential wall of the vacuum chamber 1 to the rotation center of the turntable 2. A gas introduction portion, which is a base portion, of the third gas nozzle 150 goes through and is attached to the circumferential wall of the vacuum chamber 1. The third gas nozzle 150 is configured so that the $PH_3$ gas can be supplied to the third gas nozzle 150 through a gas supplying pipe 152 having valves and a flow rate controller (not shown). The third gas nozzle 150 has plural gas ejection holes for ejecting the $PH_3$ gas downward that have diameters of about 0.5 mm and are arranged at intervals of about 10 mm along a longitudinal direction of the third gas nozzle 150. A distance between the third gas nozzle 150 and the turntable 2 (the wafer W) may be about 1 mm through 4 mm, preferably about 2 mm. In this embodiment, the wafer W is preferably heated up to about 700° C. through about 800° C. by the lamp heater 210.

Operations of the film deposition apparatus provided with the third gas nozzle 150 are explained in the following. Also in this embodiment, five wafers W are placed on the turntable 2 and the turntable 2 is rotated, while the BTBAS gas, the O₃ gas, the ethanol gas, and the nitrogen gas are ejected toward the wafers W on the turntable 2. In addition, the nitrogen gas is supplied to the center area C and the heater unit housing space; and the heater unit 7 and the heating lamp 201 are energized. Moreover, the PH₃ gas is supplied to the wafer W that has passed through the second process area 92 and thus has the silicon oxide film 242 on the upper surface. In this case, the PH₃ gas is adsorbed on the upper surface of the silicon oxide film 242. Then, when the wafer W reaches the space below the heating lamp 210, the wafer W is heated up to, for example, about 700° C. through about 800° C. by the lamp heater 210, according to which the PH₃ gas adsorbed on the upper surface of the silicon oxide film 242 is decomposed. With this, phosphorous atoms are doped in the silicon oxide film 242 and hydrogen molecules produced through thermal decomposition of the PH₃ gas are desorbed from the upper surface of the silicon oxide film 242. When the silicon oxide film 242 is doped with phosphorous atoms, a glass-transition temperature of the silicon oxide film 242 is decreased so that the silicon oxide film 242 becomes more reflowable. Therefore, even if the concave portion 230 (234) has an inverse-tapered cross section, the concave portion 230 can be filled with the silicon oxide film 242 without voids. In such a manner, plural layers of the silicon oxide film 242 are deposited on the wafer W.

The third gas nozzle 150 is preferably arranged between the first reaction gas nozzle 31 and the heating lamp 210 along the rotation direction of the turntable 2. In addition, the gas supplying pipe 152 for supplying the PH₃ gas may be joined together in the gas supplying pipe 31b of the first reaction gas nozzle 31, so that a mixed gas of the BTBAS gas and the PH₃ gas is supplied toward the wafer W through the first reaction gas nozzle 31. Moreover, a boron-containing gas such as a monoborane (BH₃) gas, a diborane (B₂H₆) gas, trimethyl boron (TMB) gas, or the like may be used as the third reaction gas, in the place of or in addition to the PH₃ gas, in order to allow at least one of the boron and phosphorous to be doped in the silicon oxide film 242. Furthermore, the film deposition apparatus according to this embodiment may be provided with the heating lamp 210 and/or the plasma injector 250.

Although the ethanol gas is used as an auxiliary gas supplied from the auxiliary gas nozzle 200 in the above embodiments, other alcohol gases such as a methanol gas (CH₃OH), pure water (H₂O), hydrogen peroxide (H₂O₂), or the like may be used. Namely, a compound gas containing a hydroxyl group (—OH) may be used as the auxiliary gas. When the pure water is used as the auxiliary gas, the BTBAS gas adsorbed on the wafer W is silanolized in accordance with the following formula:

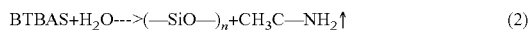

$$BTBAS + H_2O \rightarrow (-SiO-)_n + CH_3C-NH_2\uparrow \quad (2)$$

The intermediate products of the (—SiO—)ₙ in the above formula has reflowability in substantially the same manner as the siloxane polymer, and the silicon oxide film 242 produced through the reaction of the (—SiO—)ₙ with the O₃ gas also has reflowability, so that the concave portion 230 can be filled with the silicon oxide film 230 without voids.

In addition, while the film deposition methods explained above are carried out on the wafer W having the concave portions 230 in the above embodiments, those methods are applicable to a wafer having metal lines or a flat wafer.

Moreover, the film deposition apparatuses in the above embodiments may be provided with a divided heating lamp for heating the wafers W placed on the turntable 2. The divided heating lamp may have plural (e.g., three) heater elements that are arranged along a radius direction of the turntable 2 and energized independently. According to such a divided heating lamp, a temperature of the heater element located close to the outer circumference of the turntable 2 may be set higher because a wafer temperature tends to be lower near the outer circumference of the turntable 2. In addition, the heating lamp 210 may be arranged to hermetically go through the circumferential wall of the vacuum chamber 1 and to extend toward the rotation center of the turntable 2, in substantially the same manner as the gas nozzles 31, 32, 200, 41, 42 and the plasma injector 250.

The (first) reaction gases that may be used in the film deposition apparatus according to an embodiment of the present invention are dichlorosilane (DCS), hexachlorodisilane (HOD), Trimethyl Aluminum (TMA), tris(dimethyl amino) silane (3DMAS), tetrakis-ethyl-methyl-amino-zirconium (TEMAZr), tetrakis-ethyl-methyl-amino-hafnium (TEMHf), bis(tetra methyl heptandionate) strontium (Sr(THD)₂), (methyl-pentadionate)(bis-tetra-methyl-heptandionate) titanium (Ti(MPD)(THD)), monoamino-silane, or the like.

In addition, the upstream side of the first ceiling surface 44 of the separation area D with respect to the separation gas nozzles 41 (42) preferably has a greater width (a longer arc) toward the circumference of the first ceiling surface 44. This is because the gas flowing downstream along the rotation direction of the turntable 2 has a higher speed in the position closer to the circumference of the turntable 2. In view of this, it is preferable for the convex portion 4 to have a sector-shaped top view.

Figure 19:
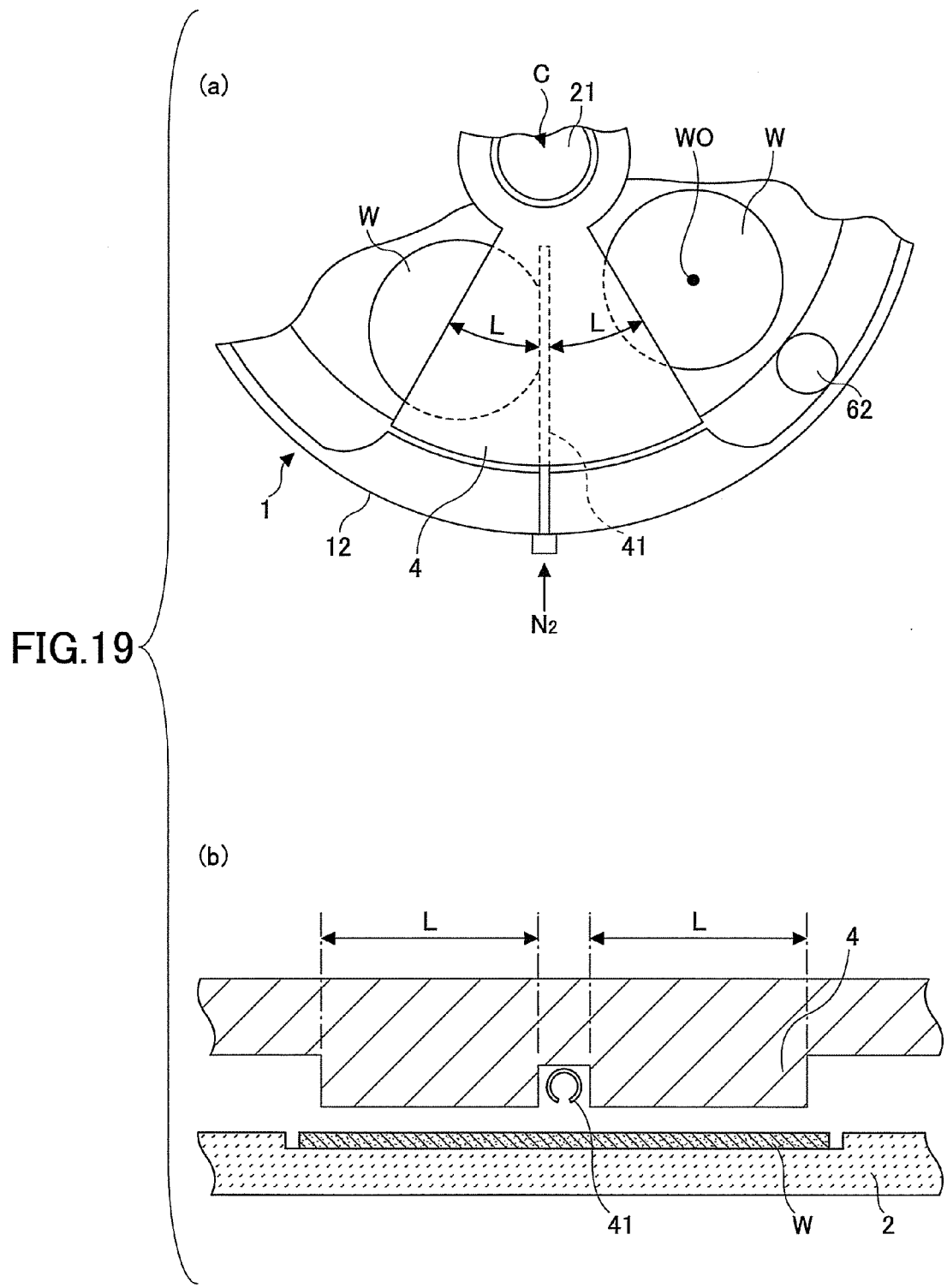
FIG. 19 is a schematic view of a convex portion in the film deposition apparatuses according to the embodiments of the present invention.

As shown in FIG. 19, the first ceiling surface 44 that creates the thin space in both sides of the separation gas nozzle 41 (42) may preferably have a length L of about 50 mm or more, the length L being measured along an arc that corresponds to a route through which a wafer center W0 passes, when the wafer W having a diameter of 300 mm is used. When the length L is set to be small, the height h of the first ceiling surface 44 from the turntable 2 needs to be small accordingly in order to efficiently impede the reaction gases from entering the thin space below the first ceiling surface 44 from both sides of the convex portion 4. In addition, when the height h of the first ceiling surface 44 from the turntable 2 is set to a certain value, the length L has to be larger in the position closer to the circumference of the turntable 2 in order to efficiently impede the reaction gases from entering the thin space below the first ceiling surface 44 because a linear speed of the turntable 2 becomes higher in the position further away from the rotation center of the turntable 2. When considered from this viewpoint, when the length L measured along the route through which the wafer center W0 passes is smaller than 50 mm, the height h of the thin space needs to be significantly small. Therefore, measures to dampen vibration of the turntable 2 are required in order to prevent the turntable 2 or the wafer W from hitting the ceiling surface 52 when the turntable 2 is rotated. Furthermore, when the rotation speed of the turntable 2 is higher, the reaction gas tends to enter the space below the convex portion 4 from the upstream side of the convex portion 4. Therefore, when the length L is smaller than about 50 mm, the rotation speed of the turntable 2 needs to be reduced, which is inadvisable in terms of throughput. Therefore, the length L is preferably about 50 mm or more, while the length L smaller than about 50 mm can demonstrate the effect explained above depending on the situation. Specifically, the length L is preferably from about one-tenth of a diameter of the wafer W through about a diameter of the wafer W, more preferably, about one-sixth or more of the diameter of the wafer W.

While the convex portion 4 is arranged in the separation area D in order to provide the lower ceiling surfaces 44, one in each side of the separation gas nozzle 41 (42) in the above embodiments, the separation gas nozzles 41, 42 may create a gas curtain by ejecting $N_2$ gas downward, so that the process areas 91, 92 are separated by the gas curtain, without the convex portion 4 (ceiling surface 44).

While the heater unit 7 serving as a heating unit for heating the wafers W has resistive heater elements in the above embodiments, the heater unit 7 may be configured with lamps. In addition, the heater unit 7 may be arranged above the turntable 2 rather than below the turntable 2, or both above and below the turntable 2. Moreover, the heater unit 7 is not necessary when the reaction of the reaction gases takes place at lower temperatures, for example, a normal temperature.

Figure 20:
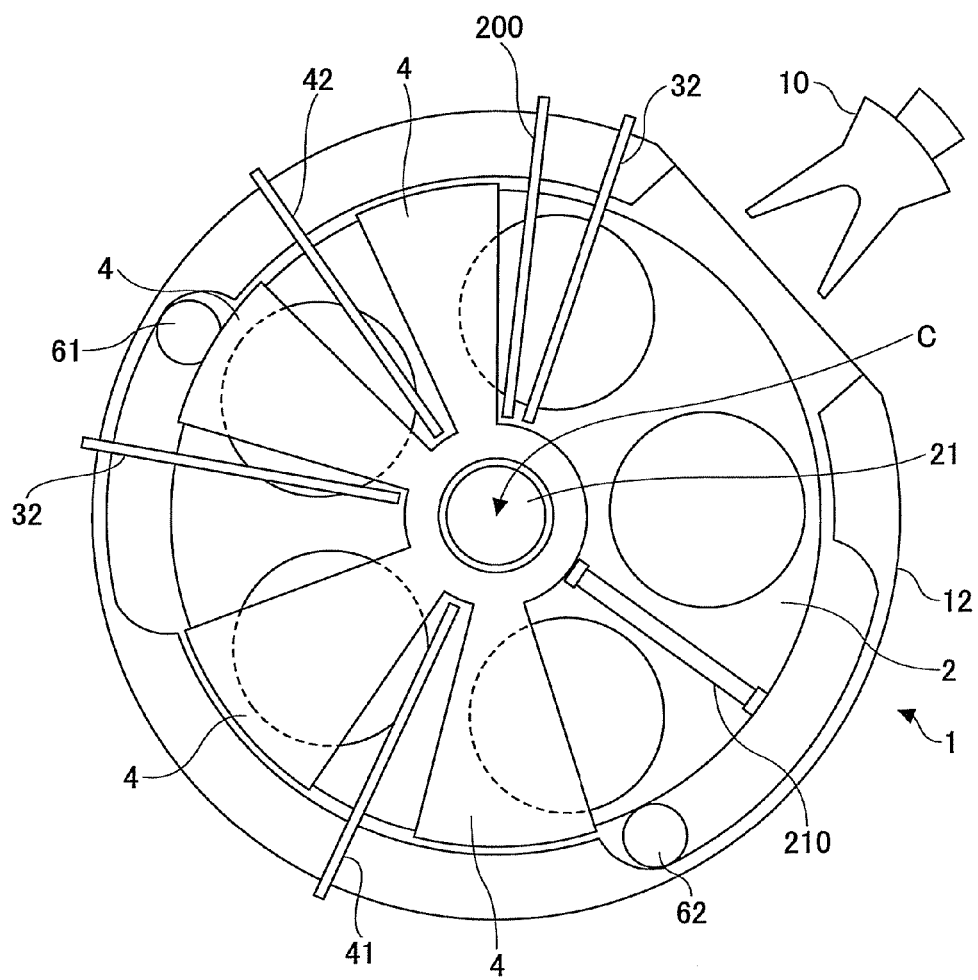
FIG. 20 is a plan view illustrating another layout of gas nozzles in the film deposition apparatus according to an embodiment of the present invention.

Next, another layout of the process areas 91, 92 and the separation areas D is explained. The separation area D may be configured by attaching two sector-shaped plates on the lower surface of the ceiling plate 11 so that the two sector-shaped plates are located on both sides of the separation gas nozzle 41 (42). FIG. 20 is a plan view illustrating such a configuration. In this case, the size of the convex portion 4 and the distance between the convex portion 4 (the two sector-shaped plates) and the separation gas nozzle 41 (42) can be determined taking into consideration ejection rates of the separation gas and the reaction gas in order to effectively demonstrate the separation effect of the separation area D.

Although the first process area 91 and the second process area 92 are defined below the higher ceiling surfaces 45 in the above embodiments, the ceiling surface, which is lower than the ceiling surface 45, may be provided on both sides of at least one of the reaction gas nozzles 31, 32 in the corresponding one of the first process area 91 and the second process area 92, in order to impede gas from entering a space below such a lower ceiling surface, which may be as low as the ceiling surface 44 of the separation area D.

In addition, the lower ceiling surface may be provided on both sides of the reaction gas nozzles 31, 32. In other words, the convex portion 4 may be provided to oppose an entire upper surface of the turntable 2, except for spaces where the reaction gas nozzles 31, 32, the separation gas nozzles 41, 42, and the auxiliary gas nozzle 200, if necessary, are arranged.

Furthermore, the gas nozzles 31, 32, 200, 41, 42 may be arbitrarily arranged, as long as the reaction gases are evacuated without being intermixed, and plural cycles of adsorption of the BTBAS gas on the upper surface of the wafer W, production of the intermediate products through silanolization by the ethanol gas, and oxidization of the intermediate products by the $O_3$ gas can be repeatedly carried out.

Fourth Embodiment

While the turntable 2 is rotated in relation to a gas supplying system (the gas nozzles 31, 32, 200, 41, 42) in the above embodiments, the gas supplying system may be rotated in relation to the stationary turntable 2. Namely, a film deposition apparatus according to an embodiment of the present invention may be configured so that the turntable 2 and the gas supplying system are rotated relative to each other. As a fourth embodiment, a configuration where the gas supplying system is rotated in relation to the stationary turntable 2, is explained with reference to FIGS. 21 through 24. In the following explanation, the same or corresponding reference symbols are given to the same or corresponding members or components, and repetitive explanation is omitted.

A susceptor 300 is provided in the vacuum chamber 1, in the place of the turntable 2 explained in the above embodiments. A rotational shaft 22 is connected to a center of a lower surface of the susceptor 300 in order to rotate the susceptor 300 when the wafers W are placed on and removed from the susceptor 300. Plural (five in the illustrated example) wafer receiving portions 24 are formed on the susceptor 300 along a circumferential direction of the susceptor 300.

Figure 21:
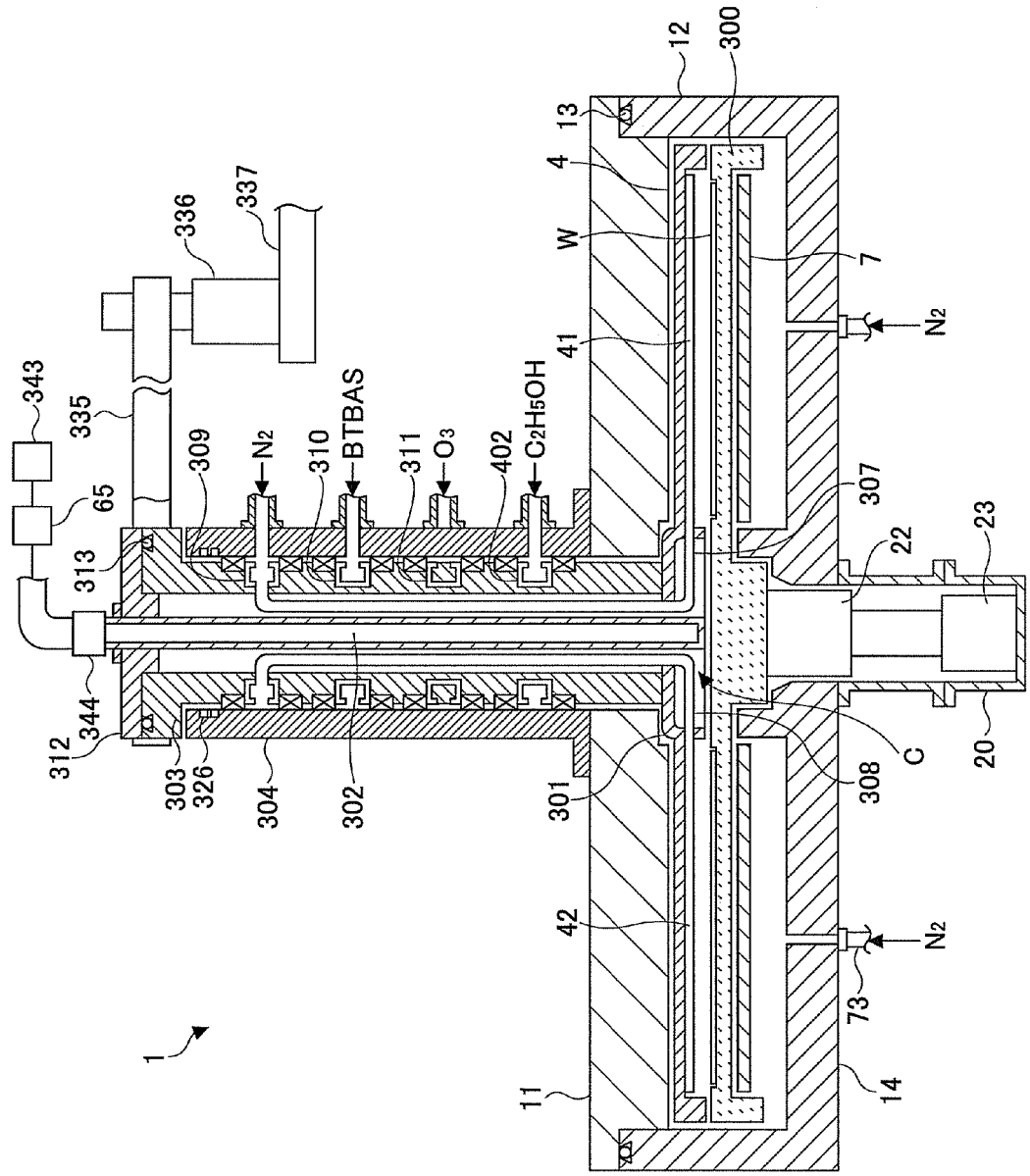
FIG. 21 is a plan view illustrating a film deposition apparatus according to yet another embodiment of the present invention.
Figure 22:
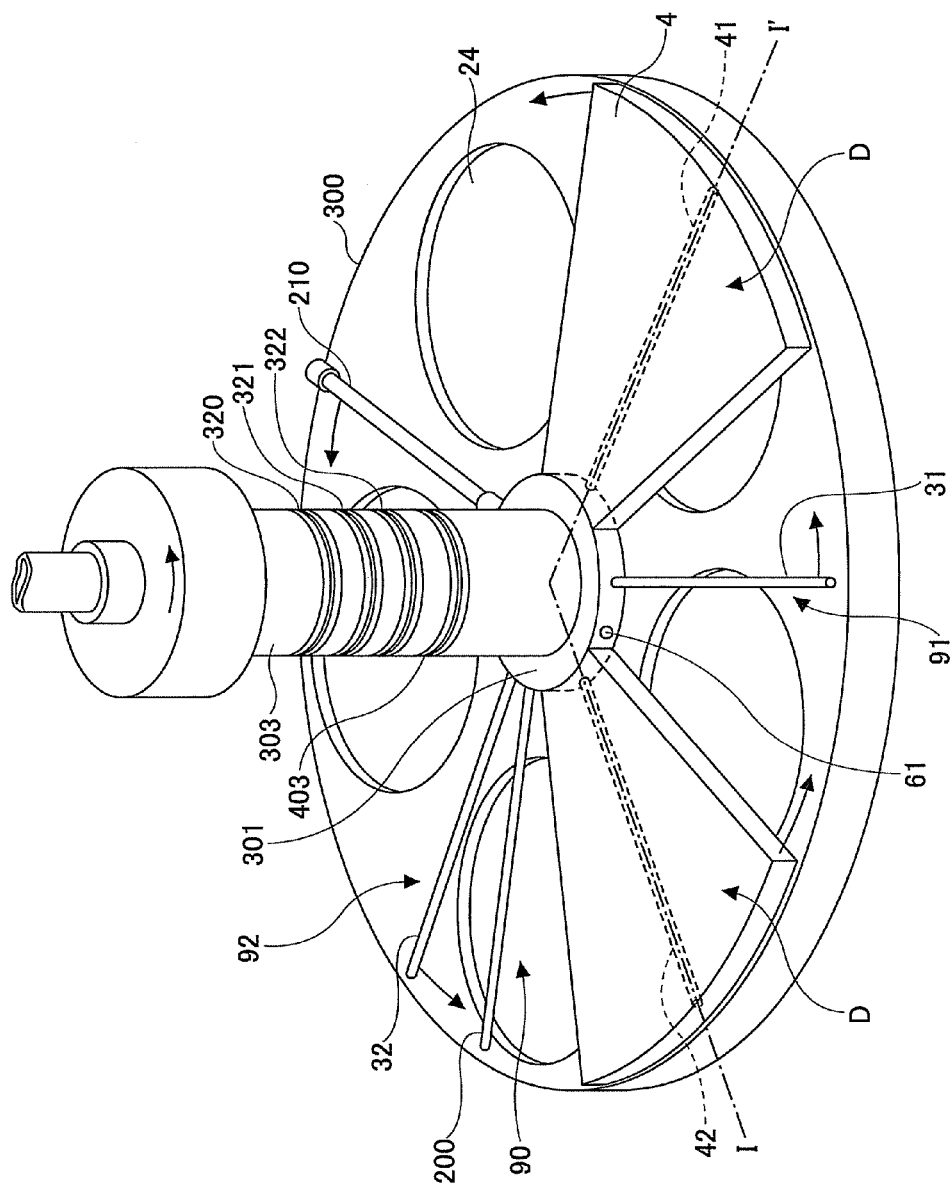
FIG. 22 is a schematic view of the film deposition apparatus of FIG. 21.
Figure 23:
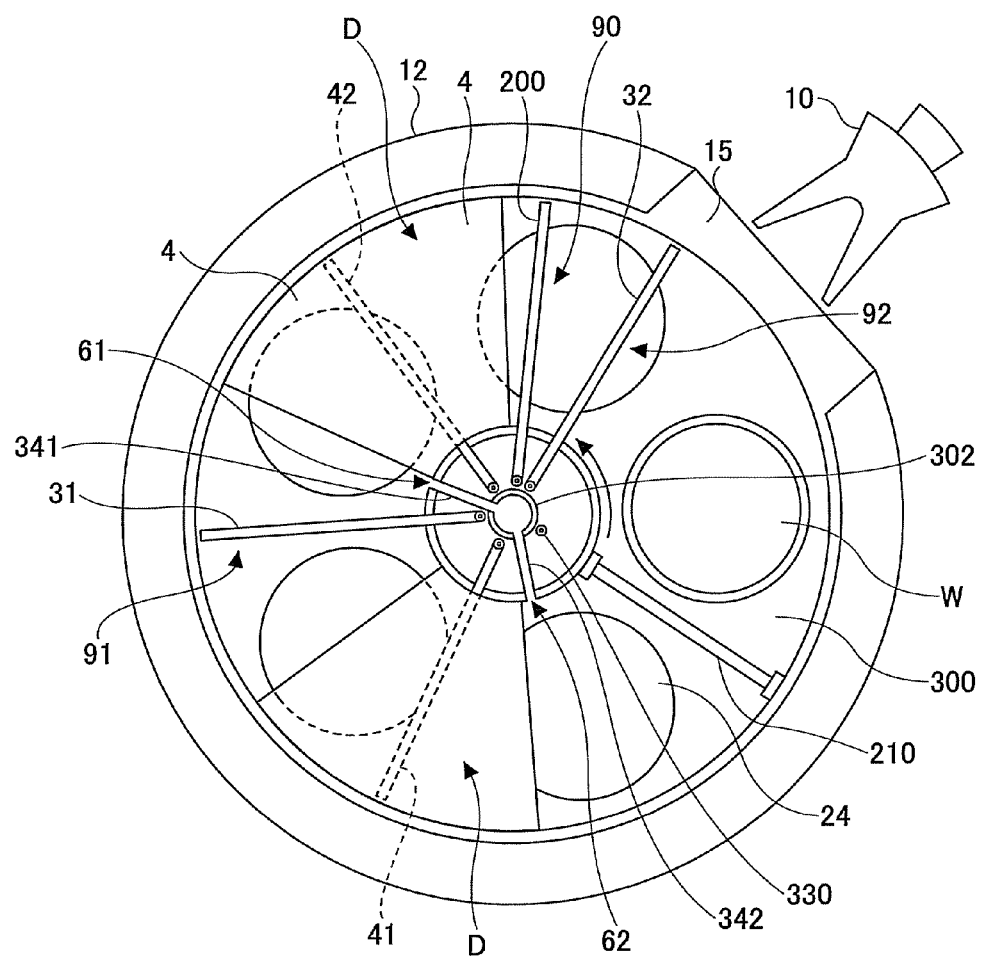
FIG. 23 is a plan view of the film deposition apparatus of FIG. 21.

As shown in FIGS. 21 through 23, the gas nozzles 31, 32, 200, 41, 42 are attached to a flattened core portion 301 that has a disk shape and are provided above a center portion of the susceptor 300. Base end portions of the gas nozzles 31, 32, 200, 41, 42 penetrate a circumferential wall of the core portion 301. The core portion 301 is configured to be rotatable counterclockwise around a vertical axis, as described later. By rotating the core portion 301, the gas nozzles 31, 32, 200, 41, 42 are rotated above the susceptor 300. Therefore, when the nozzles 31, 41, 32, 200, 42 are rotated counterclockwise when seen from above, as shown in FIG. 22, the wafers W on the susceptor 300 substantially pass through the first process area 91, the separation area D, the second process area 92, the auxiliary area 90, and the separation area D. Incidentally, when the gas supplying system (nozzles 31, 32, 200, 41, 42) is rotated around a rotation center of the core portion 301, a direction along which the nozzles 31, 32, 200, 41, 42 come closer may be referred to as downstream, and a direction along which the nozzles 31, 32, 200, 41, 42 move far away may be referred to as upstream. In addition, FIG. 22 illustrates a positional relationship among the susceptor 300, the gas nozzles 31, 32, 200, 41, 42, and the convex portions 4, where the vacuum chamber 1 (the chamber body 12 and the ceiling plate 11) and a sleeve 304 (described later) are removed.

As shown in FIG. 22, the convex portions 4 are attached to the circumferential surface of the core portion 301, and are thus rotated along with the gas nozzles 31, 32, 200, 41, 42. As shown in FIG. 23, two evacuation ports 61, 62 are provided on the circumferential surface of the core portion 301. Specifically, the evacuation port 61 is formed between the first reaction gas nozzle 31 and the convex portion 4 located downstream of the rotation direction of the first reaction gas nozzle 31, and the evacuation port 62 is formed between the second reaction gas nozzle 32 and the convex portion 4 located downstream of the rotation direction of the second reaction gas nozzle 32. Namely, the evacuation ports 61, 62 are located on both sides of the separation portion D including the separation gas nozzle 41. These evacuation ports 61, 62 are connected to an evacuation pipe 302 via corresponding conduits 341, 342, so that the reaction gases and the separation gases are evacuated from the process areas 91, 92. With these configurations, the evacuation port 61 evacuates substantially exclusively the BTBAS gas ejected from the first reaction gas nozzle 31, and the evacuation port 62 evacuates substantially exclusively the $O_3$ gas ejected from the second reaction gas nozzle 32.

In addition, the heating lamp 210 is provided downstream of the rotation direction of the second gas nozzle 32. A base end portion of the heating lamp 210 is coupled to the core portion 301, so that the heating lamp 210 can be rotated along with the nozzles 31, 32, 200, 41, 42. In this case, the feeding wires (not shown), which correspond to the feeding wires 214, 214 in the above embodiments, for supplying electricity to the heating lamp 210 are connected to the heating lamp 210 through a rotation center of a rotational cylinder 303. Incidentally, the heating lamp 210 is housed in a lamp house, in the same manner as the previous embodiments, although not shown.

As shown in FIG. 21, a rotational cylinder 303 having a cylindrical shape is connected to a center portion of an upper surface of the core portion 301, and is rotatable around a vertical axis inside a sleeve 304 attached on the ceiling plate 11 of the vacuum chamber 1. When the rotational cylinder 303 is rotated, the core portion 301 is rotated by the rotational cylinder, and thus the gas nozzles 31, 32, 200, 41, 42 are rotated by the core portion 301. The core portion 301 provides an open space on the lower side thereof. In this open space, the gas nozzles 31, 32, 200, 41, 42 that go through the circumferential wall of the core portion 301 are connected to a first reaction gas supplying pipe 305 for supplying the BTBAS gas, a second reaction gas supplying pipe 306 for supplying the $O_3$ gas, a third reaction gas supplying pipe 401 for supplying the ethanol gas, a first separation gas supplying pipe 307 for supplying the $N_2$ gas as the separation gas, and a second separation gas supplying pipe 308 for supplying the $N_2$ gas as the separation gas, respectively.

The gas supplying pipes 305 through 308, 401 are bent upward in an L shape near the rotation center of and in the open space of the core portion 301, go through a ceiling portion of the core portion 301, and extend upward inside the rotational cylinder 303.

As shown in FIGS. 21, 22, and 23, the rotational cylinder 303 has two cylinders that have different diameters and are stacked one above the other. The larger cylinder of the rotational cylinder 303 is rotatably supported by an upper end surface of the sleeve 304. With this, the rotational cylinder 303 is inserted into the sleeve 304 and is rotatable in a circumferential direction of the rotational cylinder 303 inside the sleeve 304, while the bottom end portion of the cylinder 303 goes through the ceiling plate 11 and is connected to the core portion 301.

In an outer circumferential surface of the cylinder 303, three ring-shaped gas spreading conduits are provided around the outer circumferential surface at predetermined vertical intervals. In the illustrated examples, a separation gas spreading conduit 309 for spreading the separation gas ($N_2$ gas), a first reaction gas spreading conduit 310 for spreading the BTBAS gas, a second reaction gas spreading conduit 311 for spreading the $O_3$ gas, and a third reaction gas spreading conduit 402 for supplying the ethanol gas are arranged in this order from the top to the bottom. In FIG. 21, a reference symbol 312 represents a lid portion of the rotational cylinder 303, and a reference symbol 313 represents a sealing member such as an O-ring by which the lid portion 312 and the rotational cylinder 303 are closely (or hermetically) coupled with each other.

Figure 24:
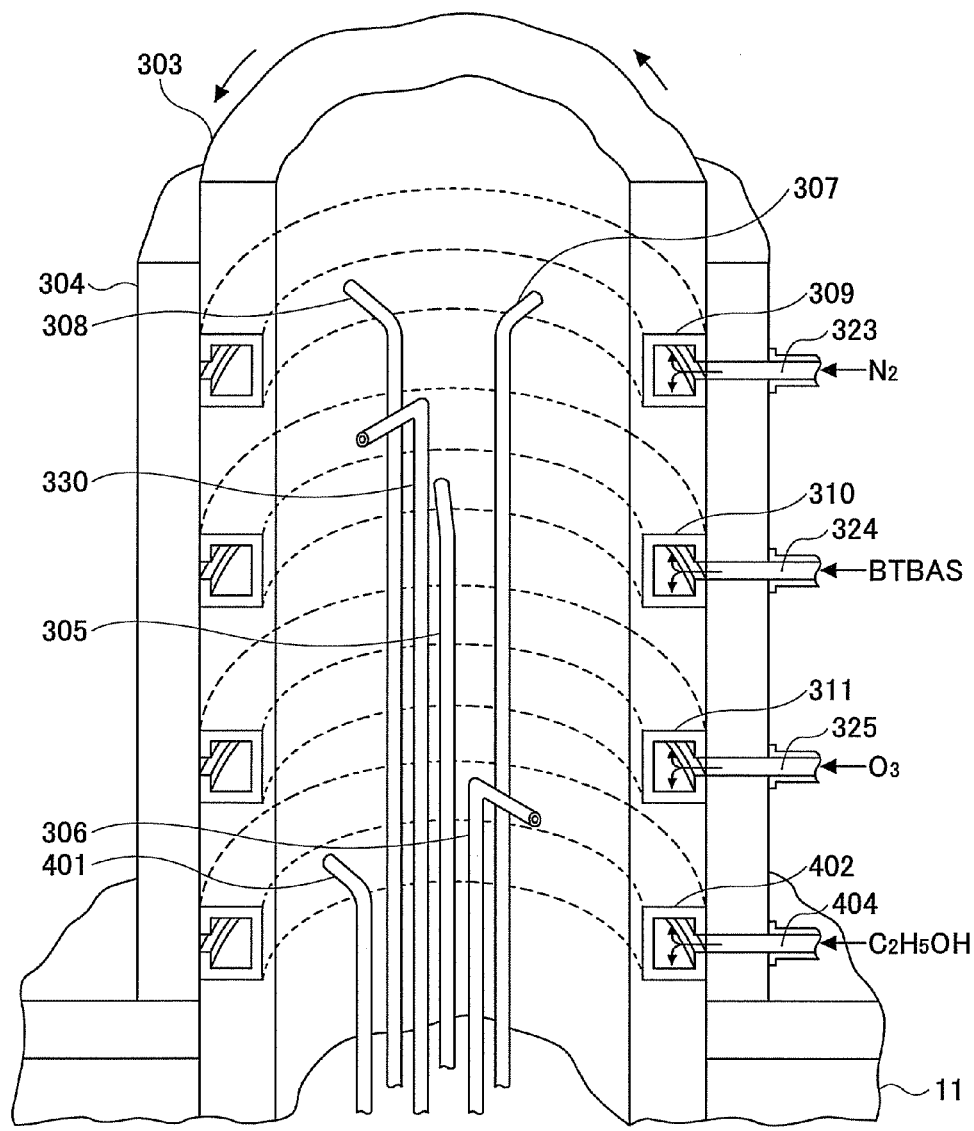
FIG. 24 is a broken perspective view of the film deposition apparatus of FIG. 21.

Referring to FIG. 22, the gas spreading conduits 309 through 311, 401 have corresponding slits 320, 321, 322, 403 that are provided around the outer circumferential surface of the rotational cylinder 303 and open toward the inner circumferential surface of the sleeve 304. The corresponding gases are supplied to the gas spreading conduits 309 through 311, 401 by way of the corresponding slits 320, 321, 322, 403. In addition, as shown in FIG. 24, gas supplying ports 323, 324, 325, 404 are provided at levels corresponding to the slits 320, 321, 322, 403 in the sleeve 304 that surrounds the rotational cylinder 303. The gases supplied to the gas supplying ports 323, 324, 325, 404 are supplied to the corresponding gas spreading conduits 309, 310, 311, 402 through the corresponding slits 320, 321, 322, 403 which are open toward the gas supplying ports 323, 324, 325, 404.

The rotational cylinder 303 inserted into the inside of the sleeve 304 has an outer diameter that is as close to an inner diameter of the sleeve 304 as possible, which makes it possible to close the slits 320, 321, 322, 403 with the inner circumferential surface of the sleeve 304, except for the gas supplying ports 323, 324, 325, 404. As a result, the gases supplied to the corresponding gas spreading conduits 309, 310, 311, 402 can spread only in the gas spreading conduits 309, 310, 311, 402, and do not leak into another gas spreading conduit, the vacuum chamber 1 or outside of the film deposition apparatus. Incidentally, a reference symbol 326 in FIG. 21 represents a sealing member such as a magnetic sealing that prevents the gases from leaking out through a gap between the rotational cylinder 303 and the sleeve 304. Although not shown, the sealing members 326 are provided above and below each of the gas spreading conduits 309, 310, 311, 402, so that the gas spreading conduits 309, 310, 311, 402 are certainly sealed. In FIG. 24, the sealing member 326 is omitted.

Referring to FIG. 24, the gas supplying pipes 307, 308 are connected at the inner circumferential surface of the rotational cylinder 303 to the gas spreading conduit 309, and the reaction gas supplying pipes 305, 306 are connected at the inner circumferential surface of the rotational cylinder 303 to the corresponding gas spreading conduits 310, 311. In addition, the gas supplying pipe 401 is connected at the inner circumferential surface of the rotational cylinder 303 to the gas spreading conduit 402. With such configurations, the separation gas supplied from the gas supplying port 323 spreads in the gas spreading conduit 309, flows into the separation gas nozzles 41, 42 through the gas supplying pipes 307, 308, and is supplied to the vacuum chamber 1; and the reaction gases supplied from the corresponding gas supplying ports 324, 325 spread in the corresponding gas spreading conduits 310, 311, flow into the corresponding reaction gas nozzles 31, 32 through the corresponding gas supplying nozzles 305, 306, and is supplied to the vacuum chamber 1. Moreover, the ethanol gas supplied from the gas supplying port 404 spreads in the gas spreading conduit 402, flows into the nozzle 200 through the gas supplying pipe 401, and is supplied to the vacuum chamber 1. Incidentally, the evacuation pipe 302 (FIG. 16) is omitted in FIG. 24, for the sake of convenience.

As shown in FIG. 24, a purge gas supplying pipe 330 is connected to the separation gas spreading conduit 309, extends downward inside the rotational cylinder 303, and is open to the inner space (open space) of the core portion 301, so that $N_2$ gas can be supplied into the inner space. As shown in FIG. 21, the core portion 301 is supported by the rotational cylinder 303 so that the bottom end of the core portion 301 is located at the height h from the upper surface of the susceptor 300. With this, the core portion 301 can be rotated without interfering with the susceptor 300. If there is a gap between the susceptor 300 and the core portion 301, the BTBAS ($O_3$) gas in the process area 91 (92) may flow into the process area 92 (91) through the gap between the susceptor 300 and the core portion 301.

However, because the purge gas ($N_2$ gas) is supplied from the purge gas supplying pipe 330 to the inner space of the core portion 301, the inner space being open toward the susceptor 301, and flows toward the process areas 91, 92 through the gap between the core portion 301 and the susceptor 300, the BTBAS ($O_3$) gas in the process area 91 (92) can be substantially prevented from flowing into the process area 92 (91) through the gap between the susceptor 300 and the core portion 301, in this embodiment. Namely, the film deposition apparatus in this embodiment includes the center area C that is defined by the center portions of the susceptor 300 and the vacuum chamber 1, and has an ejection opening formed along the rotation direction of the core portion 301 in order to eject the purge gas along the upper surface of the susceptor 300. In this case, the purge gas serves as the separation gas to substantially prevent the BTBAS ($O_3$) gas in the process area 91 (92) from flowing into the process area 92 (91) through the gap between the susceptor 300 and the core portion 301. Incidentally, the gap between the core portion 301 and the susceptor 300 corresponds to the ejection opening.

Referring again to FIG. 21, a driving belt 335 is wound around an outer circumference of the cylinder having a larger diameter of the rotational cylinder 303. The driving belt 335 conveys rotational force from the driving portion 336 serving as a rotation mechanism arranged above the vacuum chamber 1 to the rotational cylinder 303, thereby rotating the rotational cylinder 303 inside the sleeve 304. Incidentally, a reference symbol 337 represents a supporting member that supports the driving portion 336 above the vacuum chamber 1.

In addition, the evacuation pipe 302 is arranged along the rotational center of the rotational cylinder 303 inside the rotational cylinder 303, as shown in FIG. 21. A bottom end portion of the evacuation pipe 302 goes through the upper surface of the core portion 301 into the inner space of the core portion 301, and closes in the inner space. Suction pipes 341, 342 are connected at one end to a circumference of the evacuation pipe 302 extending inside the core portion 301, as shown in FIG. 23. In addition, the other ends of the suction pipes 341, 342 are open in the circumference of the core portion 301. With such configurations, the vacuum chamber 1 can be evacuated by the evacuation pipe 302 through the suction pipes 341, 342, without evacuating the $N_2$ gas inside the core portion 301.

Incidentally, while the evacuation pipe 302 is omitted in FIG. 24, as stated above, the gas supplying pipes 305, 306, 307, 308 and the purge gas supplying pipe 330 are arranged around the evacuation pipe 302.

As shown in FIG. 21, an upper end portion of the evacuation pipe 302 goes through the lid portion 312 of the rotational cylinder 303 and is connected to, for example, a vacuum pump 343 serving as an evacuation portion. Incidentally, a reference symbol 344 in FIG. 21 represents a rotary joint that rotatably connects the evacuation pipe 302 to a pipe downstream of the evacuation pipe 302.

A film deposition method that may be carried out using the film deposition apparatus according to this embodiment is explained, focusing on differences from the previously explained film deposition methods (operations of the film deposition apparatuses). First, when the wafer W is transferred into the vacuum chamber 1, the susceptor 300 is intermittently rotated, so that five wafers W are placed in the corresponding concave portions 24 with cooperative operations of the transfer arm 10 and the elevation pins 16.

Then, the rotational cylinder 303 is rotated counterclockwise. At this time, while the gas spreading conduits 309, 310, 311, 402 provided in the rotational cylinder 303 are rotated accordingly, parts of the slits 320, 321, 322, 403 of the corresponding gas spread conduits 309, 310, 311, 402 are always open to corresponding openings of the gas supplying ports 323, 324, 325, 404. Therefore, the gases can be continuously supplied to the corresponding gas spreading conduits 309, 310, 311, 402.

The gases supplied to the gas spreading conduits 309 through 311, 402 are supplied to the corresponding process areas 91, 92, 90 and separation areas D from the corresponding reaction gas nozzles 31, 32, 200 and separation gas nozzles 41, 42 through the corresponding gas supplying pipes 305 through 308, 401 connected to the corresponding gas spreading conduits 309 through 311, 402. Because these gas supplying pipes 305 through 308, 401 are fixed on the rotational cylinder 303, and the reaction gas nozzles 31, 32 and the separation gas nozzles 41, 42 are fixed on the rotational cylinder 303 via the core portion 301, the gas supplying pipes 305 through 308, 401 and the gas nozzles 31, 32, 200, 41, 42 are rotated along with the rotational cylinder 303 and supply the corresponding gases to the vacuum chamber 1. In addition, the heating lamp 210 is also rotated along with the nozzles 31, 32, 200, 41, 42 and heats the wafer W when the heating lamp 210 passes above the wafer W.

At this time, the purge gas supplying pipe 330 rotating integrally with the rotational cylinder 303 supplies the $N_2$ gas serving as the separation gas, and thus the $N_2$ gas is ejected from the center area C, namely, the gap between the core portion 301 and the susceptor 300, along the upper surface of the susceptor 300. In addition, because the evacuation ports 61, 62 are formed in the circumference of the core portion 301 in order to open to the spaces below the second ceiling surfaces 45 where the reaction gas nozzles 31, 32 are arranged, pressures of the spaces below the second ceiling surfaces 45 are lower than the pressures of the thin spaces below the first ceiling surface 44 and the center area C. Therefore, the BTBAS gas and the $O_3$ gas are not intermixed and are independently evacuated from the vacuum chamber 1 in the same manner as the film deposition apparatuses in the previous embodiments.

In such a manner, the wafers W placed on the stationary susceptor 300 can apparently pass through the process areas 91, 92, 90 in this order, so that adsorption of the BTBAS gas, supplying the ethanol gas, oxidization due to the $O_3$ gas, and heating treatment are carried out in this order.

Also in this embodiment, the concave portions 230 formed in the wafer W can be filled with the silicon oxide film 242 (FIG. 12) without voids. Namely, the same effects (advantages) can be provided by this embodiment. Incidentally, the film deposition apparatus according to this embodiment may be provided with the third gas nozzle (third reaction gas supplying portion) 150. In this case, a gas supplying pipe to be connected to the third gas nozzle 150 is provided inside the rotational cylinder 303, in the same manner as the gas nozzles 31, 32, 200, 41, 42, and the doping gas is supplied to the third gas nozzle 150 through a slit formed in the sleeve 304. In addition, the film deposition apparatus according to this embodiment may be provided with the plasma injector 250.

Figure 25:
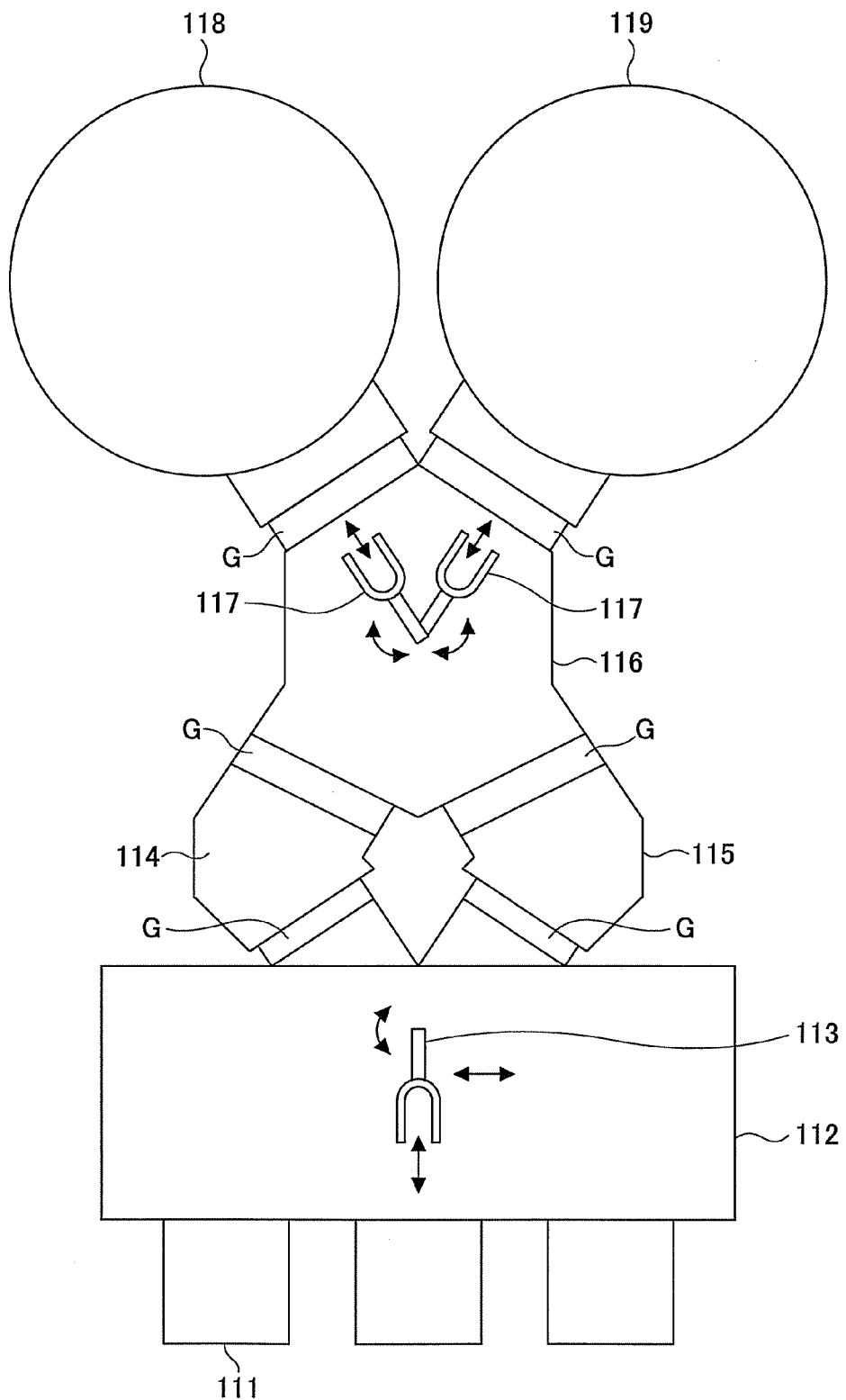
FIG. 25 is a plan view of a substrate processing apparatus to which the film deposition apparatuses according to the embodiments of the present invention are integrated.

Next, a substrate process apparatus into which the film deposition apparatus according to an embodiment of the present invention is explained with reference to FIG. 25. In FIG. 25, a reference symbol 111 represents a transfer carrier, which is called a Front Opening Unified Pod (FOUP), for carrying, for example, 25 wafers W; a reference symbol 112 represents an atmospheric transfer chamber 112 where a transfer arm 113 is provided; reference symbols 114, 115 represent load lock chambers (preliminary chambers) whose inside pressure is switched from an atmospheric pressure to a reduced pressure; a reference symbol 116 represents a vacuum transfer chamber where two transfer arms 117, 117, which correspond to the transfer arm 10, are provided; and reference symbols 118, 119 represent the film deposition apparatus according to the embodiments of the present invention.

Next, a process flow of a process carried out in this substrate process apparatus is explained. First, the transfer carrier 111 is brought onto a transfer in/out port (not shown) including a susceptor, and connected to the atmospheric transfer chamber 112. Then, a lid of the transfer carrier 111 is opened by an opening/closing mechanism (not shown) and a wafer W is taken out from the transfer carrier 111 by the transfer arm 113. Next, the wafer W is transferred to the load lock chamber 114 (115). After the load lock chambers 114 (115) is evacuated to a reduced pressure from an atmospheric pressure, the wafer W in the load lock chamber 114 (115) is transferred further to one of the film deposition apparatuses 118, 119 through the vacuum transfer chamber 116 by the transfer arm 117. In the film deposition apparatus 118 (119), the previously explained film deposition method is carried out.

According to the substrate process apparatus, because the wafer process apparatus has two film deposition apparatuses 118, 119 each of which can house five wafers at a time, the ALD (or MLD) mode deposition can be performed at high throughput.

While the present invention has been described in reference to the foregoing embodiments, the present invention is not limited to the disclosed embodiments, but may be modified or altered within the scope of the accompanying claims.

What is claimed is:

1. A film deposition apparatus for depositing a film on a substrate by relatively rotating a table on which the substrate is placed and plural reaction gas supplying portions configured to supply corresponding reaction gases that react with one another in order to supply in turn the reaction gases to the substrate, thereby producing a layer of a reaction product, the film deposition apparatus comprising:

a substrate receiving area provided to place the substrate on an upper surface of the table in a vacuum chamber;

a rotational mechanism configured to rotate the plural reaction gas supplying portions and the table in relation to each other so that the substrate is located in turn in plural process areas where the corresponding reaction gases are supplied from the corresponding gas supplying portions;

a first reaction gas supplying portion configured to supply a first reaction gas in order to adsorb the first reaction gas on the substrate, wherein the first reaction gas supplying portion opposes the substrate receiving area on the table;

an auxiliary gas supplying portion configured to supply to the substrate an auxiliary gas that reacts with the first reaction gas adsorbed on the substrate to produce an intermediate product having reflowability, wherein the auxiliary gas supplying portion is provided away from and downstream relative to the first reaction gas supplying portion along a relative rotation direction of the table in relation to the plural reaction gas supplying portions, and opposes the substrate receiving area on the table;

a second reaction gas supplying portion configured to supply to the substrate a second reaction gas that reacts with the intermediate product on the substrate to produce a reaction product, wherein the second reaction gas supplying portion is provided downstream relative to the auxiliary gas supplying portion along the relative rotation direction, and opposes the substrate receiving area on the table;

a first separation gas supplying portion in a first separation areas provided between a first process area where the first reaction gas is supplied and an auxiliary process area where the auxiliary gas is supplied, in order to separate atmospheres of the first process area and the auxiliary process area;

a second separation gas supplying portion in a second separation area provided between a second process area where the second reaction gas is supplied and the first process area in order to separate atmospheres of the second process area and the first process area, wherein each of the first and second separation areas includes a convex portion whose lower surface provides a first ceiling surface lower than the second ceiling surface of the first process area, the auxiliary process area and the second process area in order to separate the atmospheres of the first, auxiliary, and second process areas, the convex portion providing the first ceiling surface in the first and second separation areas having a greater width on an upstream side along a circumference of the first ceiling surface; and a heating portion configured to heat the substrate in order to densify the reaction product, wherein the heating portion is provided downstream relative to the second gas supplying portion and upstream relative to the first reaction gas supplying portion along the relative rotation direction, and opposes the substrate receiving area on the table, wherein the second separation gas supplying portion in the second separation area cools the substrate by a gas supplied from the second separation gas supplying portion.

2. The film deposition apparatus recited in claim 1, wherein the heating portion includes a heating lamp provided to oppose the substrate receiving area on the table.

3. The film deposition apparatus recited in claim 1, further comprising a control portion configured to output a control signal so that adsorption of the first reaction gas on the substrate, production of the intermediate product, production of the reaction product, and densification of the reaction product are repeated in this order plural times by rotating the table in order to carry out a cycle of supplying to the substrate the first reaction gas, the auxiliary gas, and the second gas in this order from the first gas supplying portion, the auxiliary gas supplying portion, and the second gas supplying portion, respectively, and then by heating the substrate in order to densify the reaction product every time the cycle is carried out.

4. The film deposition apparatus recited in claim 1, further comprising a control portion configured to output a control signal so that adsorption of the first reaction gas on the substrate, production of the intermediate product, and production of the reaction product are repeated in this order plural times by rotating the table in order to carry out a cycle of supplying to the substrate the first reaction gas, the auxiliary gas, and the second gas in this order from the first gas supplying portion, the auxiliary gas supplying portion, and the second gas supplying portion, respectively, and then by heating the substrate in order to densify the reaction product after the cycle is carried out plural times.

5. The film deposition apparatus recited in claim 1, further comprising a plasma supplying portion configured to supply plasma to the substrate, wherein the plasma supplying portion is provided downstream relative to the second reaction gas supplying portion and upstream relative to the heating portion along the relative rotation direction, and opposes the substrate receiving area on the table.

6. The film deposition apparatus recited in claim 1, further comprising a third reaction gas supplying portion configured to supply a third reaction gas containing a dopant of at least one of boron and phosphorus to an upper surface of the substrate in order to dope the dopant into the reaction product, wherein the third reaction gas supplying portion is provided downstream relative to the first reaction gas supplying portion and upstream relative to the heating portion along the relative rotation direction.

* * * * *